(12) United States Patent
Lim et al.

(10) Patent No.: US 12,433,051 B2
(45) Date of Patent: Sep. 30, 2025

(54) IMAGE SENSOR INCLUDING A LIGHT BLOCKING FILM

(71) Applicant: SAMSUNG ELECTRONICS CO., LTD., Suwon-si (KR)

(72) Inventors: Kang Mook Lim, Sejong-si (KR); Seung Sik Kim, Hwaseong-si (KR); Jae Hoon Jeon, Hwaseong-si (KR); Je Yeoun Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 475 days.

(21) Appl. No.: 17/872,056

(22) Filed: Jul. 25, 2022

(65) Prior Publication Data

US 2023/0057857 A1 Feb. 23, 2023

(30) Foreign Application Priority Data

Aug. 17, 2021 (KR) .......................... 10-2021-0107908

(51) Int. Cl.
*H10F 39/00* (2025.01)
*H10F 39/18* (2025.01)

(52) U.S. Cl.
CPC ..... *H10F 39/8057* (2025.01); *H10F 39/8063* (2025.01); *H10F 39/18* (2025.01); *H10F 39/811* (2025.01)

(58) Field of Classification Search
CPC ............. H01L 27/14623; H10F 39/807; H10F 39/811; H10F 39/8057
See application file for complete search history.

(56) References Cited

U.S. PATENT DOCUMENTS 7,242,820 B2 7/2007 Nam
8,964,081 B2 2/2015 Ohkubo et al.
(Continued)

FOREIGN PATENT DOCUMENTS

JP 2006-032497 2/2006
KR 10-2009-0046486 5/2009
(Continued)

OTHER PUBLICATIONS

Office Action dated May 26, 2025 issued in corresponding Korean Patent Application No. 10-2021-0107908.

*Primary Examiner* — Thanh Luu
(74) *Attorney, Agent, or Firm* — MORGAN, LEWIS & BOCKIUS LLP

(57) ABSTRACT

An image sensor includes: a substrate including a first area and a second area; a plurality of unit pixels disposed in the substrate, wherein each of the plurality of unit pixels includes a photoelectric conversion layer; a pixel defining pattern separating the unit pixels from each other; a surface insulating film disposed on the substrate; a line structure disposed on the substrate, and including a first interline insulating film and a wire pattern disposed in the first interline insulating film; a micro-lens disposed in the first area; and a light-blocking film disposed in the second area. The light-blocking film includes: a horizontal light-blocking film extending along a top surface of the surface insulating film; and a vertical light-blocking film extending through the surface insulating film and the substrate. The vertical light-blocking film is electrically connected to the wire pattern. The light-blocking film is electrically connected to the pixel defining pattern.

18 Claims, 27 Drawing Sheets

(56) References Cited

U.S. PATENT DOCUMENTS

| | | | |
|---|---|---|---|
| 10,165,211 B1 | 12/2018 | Borthakur et al. | |
| 10,319,771 B2 | 6/2019 | Lee | |
| 10,475,837 B2 | 11/2019 | Moriya et al. | |
| 10,559,616 B2 | 2/2020 | Uesaka | |
| 10,804,304 B2 | 10/2020 | Noh et al. | |
| 2015/0255495 A1* | 9/2015 | Park | H10F 39/186 |
| | | | 257/446 |
| 2018/0204874 A1 | 7/2018 | Lee et al. | |
| 2019/0006407 A1* | 1/2019 | Uesaka | H01L 27/14627 |
| 2019/0221597 A1* | 7/2019 | Noh | H01L 27/14605 |
| 2020/0105836 A1 | 4/2020 | Kim et al. | |
| 2020/0119072 A1* | 4/2020 | Lim | H10F 39/8057 |

FOREIGN PATENT DOCUMENTS

| | | |
|---|---|---|
| KR | 10-2015-0105076 | 9/2015 |
| KR | 10-2018-0085090 | 7/2018 |
| KR | 10-2019-0086246 | 7/2019 |
| KR | 10-2020-0038147 | 4/2020 |

\* cited by examiner

IMAGE SENSOR INCLUDING A LIGHT BLOCKING FILM

CROSS-REFERENCE TO RELATED APPLICATION

This application claims priority under 35 U.S.C. § 119 to Korean Patent Application No. 10-2021-0107908 filed on Aug. 17, 2021 in the Korean Intellectual Property Office, the disclosure of which is incorporated by reference herein in its entirety.

TECHNICAL FIELD

The present inventive concept relates to an image sensor, and more particularly to, an image sensor including a light blocking film.

DISCUSSION OF THE RELATED ART

Generally, an image sensor has a semiconductor element that converts optical information into an electrical signal. The image sensor may include a CCD (Charge Coupled Device) image sensor and a CMOS (Complementary Metal-Oxide Semiconductor) image sensor.

The image sensor may be in a form of a package. Typically, In this case, the package may be configured to protect the image sensor and to allow light to be incident to a photo receiving surface or a sensing area of the image sensor.

Recently, a backside irradiation type (BSI) image sensor, in which incident light is irradiated through a back surface of a semiconductor substrate so that pixels formed in the image sensor have increased light-receiving efficiency and light sensitivity, is currently under development.

SUMMARY

According to an exemplary embodiment of the present inventive concept, an image sensor includes: a substrate including first and second surfaces opposite to each other, and including a first area and a second area; a plurality of unit pixels disposed in the substrate, wherein each of the plurality of unit pixels includes a photoelectric conversion layer; a pixel defining pattern extending from the first surface to the second surface of the substrate, wherein the pixel defining pattern separates the unit pixels from each other; a surface insulating film disposed on the second surface of the substrate; a line structure disposed on the first surface of the substrate, wherein the line structure includes a first interline insulating film and a wire pattern disposed in the first interline insulating film; a micro-lens disposed in the first area; and a light-blocking film disposed in the second area. The light-blocking film includes: a horizontal light-blocking film extending along a top surface of the surface insulating film; and a vertical light-blocking film extending through the surface insulating film and the substrate, wherein the vertical light-blocking film is electrically connected to the wire pattern. The light-blocking film is electrically connected to the pixel defining pattern.

According to an exemplary embodiment of the present inventive concept, an image sensor includes: a substrate including first and second surfaces facing each other, and including a first area and a second area; a pixel defining pattern extending from the first surface of the substrate to the second surface of the substrate, wherein the pixel defining pattern includes a first pixel defining line extending in a first direction, and a second pixel defining line extending in a second direction different from the first direction; a plurality of unit pixels defined by the pixel defining pattern and disposed in the substrate, wherein each of the plurality of unit pixels includes a photoelectric conversion layer; a micro-lens disposed in the first area; a line structure disposed on the first surface of the substrate, wherein the line structure includes a first interline insulating film and a wire pattern disposed in the first interline insulating film; a horizontal light-blocking film disposed in the second area and on the second surface of the substrate; and a vertical light-blocking film extending through the substrate and connected to the horizontal light-blocking film, wherein the vertical light-blocking film is electrically connected to the wire pattern, wherein the vertical light-blocking film extends in a third direction, and separates the first pixel defining line, wherein the third direction is different from at least the first direction. The vertical light-blocking film and the pixel defining pattern are electrically connected to each other.

According to an exemplary embodiment of the present inventive concept, an image sensor includes: a substrate including first and second surfaces opposite to each other, and including a first area, a second area, and a third area; a plurality of unit pixels disposed in the substrate, wherein each of the plurality of unit pixels includes a photoelectric conversion layer; a pixel defining pattern between the first surface and the second surface of the substrate, wherein the pixel defining pattern separates the unit pixels from each other; a surface insulating film disposed on the second surface of the substrate; a line structure disposed on the first surface of the substrate, wherein the line structure includes an interline insulating film and a wire pattern disposed in the interline insulating film; a micro-lens disposed in the first area; a light-blocking film disposed in the second area. The light-blocking film includes: a horizontal light-blocking film extending along a top surface of the surface insulating film; and a vertical light-blocking film extending through the surface insulating film and the substrate, wherein the vertical light-blocking film is electrically connected to the wire pattern. The image sensor further includes a pad pattern disposed in the third area, wherein the pad pattern is electrically connected to the light-blocking film, wherein the pixel defining pattern includes a plurality of first pixel defining lines and a plurality of second pixel defining lines, wherein the plurality of first pixel defining lines extend in a first direction, and the plurality of second pixel defining lines extend in a second direction different from the first direction, wherein the vertical light-blocking film extends in the second direction in a plan view of the image sensor and separates each of the first pixel defining lines, wherein the light-blocking film is electrically connected to the pixel defining pattern.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

Figure 1:
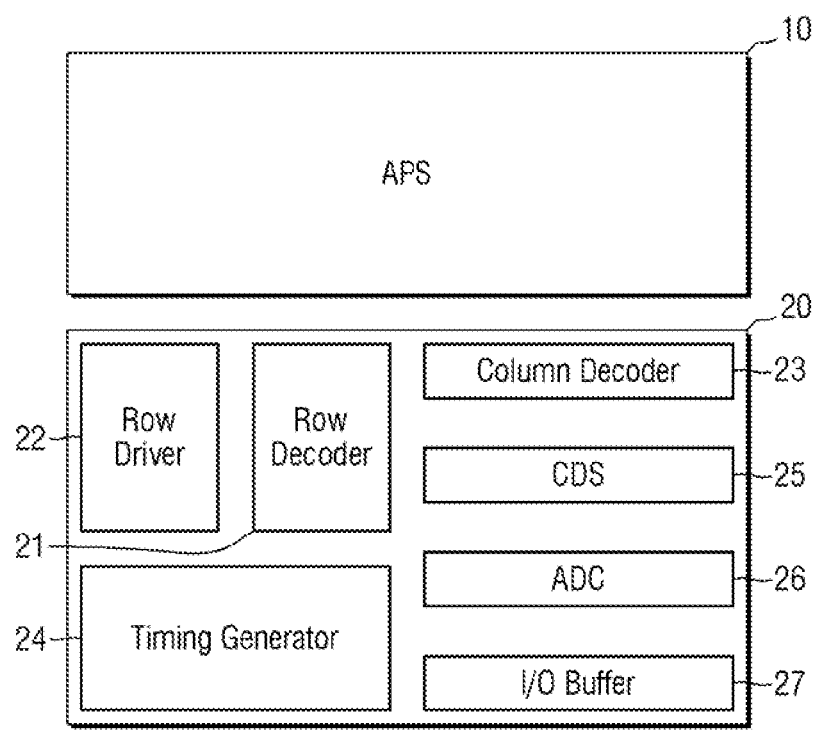
FIG. 1 is a block diagram illustrating an image sensor according to an exemplary embodiment of the present inventive concept.

For simplicity and clarity of illustration, elements in the drawings are not necessarily drawn to scale. The same reference numbers in different drawings represent the same or similar elements, and as such may perform similar functionality. Various exemplary embodiments of the present inventive concept are illustrated and described further below. In addition, the description herein is intended to include alternatives, modifications, and equivalents within the spirit and scope of the present inventive concept.

A shape, a size, a ratio, an angle, a number, etc. disclosed in the drawings for illustrating an exemplary embodiment of the present inventive concept are merely examples, and the present inventive concept is not limited thereto.

As used herein, the singular forms "a" and "an" are intended to include the plural forms as well, unless the context clearly indicates otherwise. As used herein, the term "and/or" includes any and all combinations of one or more of the associated listed items. Expression such as "at least one of" when preceding a list of elements may modify the entirety of list of elements and might not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present inventive concept.

In addition, it will also be understood that when a first element or layer is referred to as being present "on" or "beneath" a second element or layer, the first element may be disposed directly on or directly beneath the second element or may be disposed indirectly on or indirectly beneath the second element with a third element or layer being disposed between the first and second elements or layers. It will be understood that when an element or layer is referred to as being "connected to", or "coupled to" another element or layer, the element may be directly on, directly connected to, or directly coupled to the other element or layer, or one or more intervening elements or layers may be present therebetween. In addition, it will also be understood that when an element or layer is referred to as being "between" two elements or layers, it may be the only element or layer between the two elements or layers, or one or more intervening elements or layers may also be present.

In one example, when a certain embodiment may be implemented differently, a function or operation specified in a specific block (or, e.g., circuit) may occur in a sequence different from that specified in a flowchart. For example, two consecutive blocks may actually be executed at the same time. Depending on a related function or operation, the blocks may be executed in a reverse sequence.

The features of the various exemplary embodiments of the present inventive concept may be partially or entirely combined with each other, and may be technically associated with each other or operate with each other. The exemplary embodiments of the present inventive concept may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Hereinafter, with reference to FIGS. 1 to 18, an image sensor according to exemplary embodiments of the present inventive concept will be described.

FIG. 1 is a block diagram illustrating an image sensor according to an exemplary embodiment of the present inventive concept.

Referring to FIG. 1, an image sensor according to an exemplary embodiment of the present inventive concept may include a first block 10 and a second block 20. The first block 10 may be an active pixel sensor array (APS). The second block 20 may include a row decoder 21, a row driver 22, a column decoder 23, a timing generator 24, a correlated double sampler (CDS) 25, an analog to digital converter (ADS) 26, and an input/output buffer 27.

Although FIG. 1 shows that the first block 10 and the second block 20 are planarly arranged, the present inventive concept is not limited thereto. For example, each of the first block 10 and the second block 20 may be formed in a chip, and the chips may be stacked vertically to form the image sensor. For example, a first chip including the first block 10 and a second chip including the second block 20 may be formed, while the first chip and the second chip may be stacked vertically. For example, in this connection, the first chip may be included in an upper plate, while the second chip may be included in a lower plate. The lower and upper plates may be stacked vertically on each other.

The active pixel sensor array 10 may include a plurality of unit pixels arranged two-dimensionally, and may convert an optical signal into an electrical signal. The active pixel sensor array 10 may be driven based on a plurality of drive signals such as a pixel selection signal, a reset signal and a charge transmit signal from the row driver 22. Further, the electrical signal, which is converted from the optical signal by the active pixel sensor array 10, may be provided to the correlated double sampler 25.

The row driver 22 may provide a plurality of drive signals for driving a plurality of unit pixels to the active pixel sensor array 10 according to a decoding result using the row decoder 21. When the unit pixels are arranged in a matrix form, the drive signal may be provided on each row basis.

The timing generator 24 may provide a timing signal and a control signal to each of the row decoder 21 and the column decoder 23.

The correlated double sampler (CDS) 25 may receive, hold and sample the electrical signal generated from the active pixel sensor array 10. The correlated double sampler 25 may sample a specific noise level and a signal level caused by the electrical signal in a double manner and may output a difference level corresponding to a difference between the noise level and the signal level.

The analog to digital converter (ADC) 26 may convert an analog signal corresponding to the difference level output from the correlated double sampler 25 into a digital signal and may output the digital signal.

The input/output buffer 27 may latch the digital signal, and may sequentially output the latched digital signal to an image signal processing unit according to the decoding result of the column decoder 23.

Figure 2:
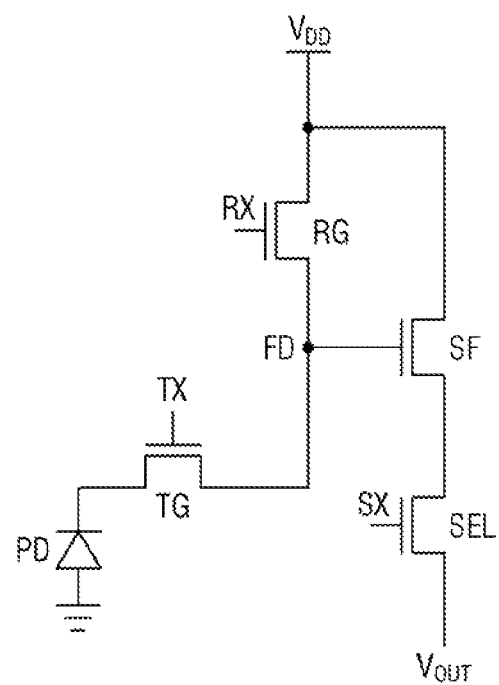
FIG. 2 is a circuit diagram illustrating a unit pixel of an image sensor according to an exemplary embodiment of the present inventive concept.

FIG. 2 is a circuit diagram illustrating a unit pixel of an image sensor according to an exemplary embodiment of the present inventive concept. For reference, FIG. 2 may show a 4T structure of the first block 10 of FIG. 1.

Referring to FIG. 2, each unit pixel may include a photoelectric conversion layer PD, a transmit transistor TG, a floating diffusion area FD, a reset transistor RG, a source follower transistor SF and a select transistor SEL.

The photoelectric conversion layer PD may generate electric charges in proportion to an amount of light incident thereto from an outside. The photoelectric conversion layer PD may be coupled with the transmit transistor TG that transfers generated and accumulated charges to the floating diffusion area FD. The floating diffusion area FD may refer to an area that converts the charges into voltage. The floating diffusion area FD has parasitic capacitance such that the charges may be stored therein in an accumulated manner.

One end of the transmit transistor TG may be connected to the photoelectric conversion layer PD, while the other end of the transmit transistor TG may be connected to the floating diffusion area FD. The transmit transistor TG may be embodied as a transistor driven by a predefined bias (e.g., a transmit signal TX). For example, the transmit transistor TG may transmit the electric charges generated from the photoelectric conversion layer PD to the floating diffusion area FD in response to the transmit signal TX.

The source follower transistor SF may amplify change in an electrical potential of the floating diffusion area FD upon receiving the charge from the photoelectric conversion layer PD and may output the amplified change to an output line $V_{OUT}$. When the source follower transistor SF is turned on, a predefined electrical potential, for example, a power voltage $V_{DD}$ provided to a drain of the source follower transistor SF may be transferred to a drain area of the select transistor SEL.

The select transistor SEL may select a unit pixel to be read on a row basis. The select transistor SEL may be embodied as a transistor driven by a select line which applies a predefined bias (e.g., a row select signal SX).

The reset transistor RG may periodically reset the floating diffusion area FD. The reset transistor RG may be embodied as a transistor driven by a reset line that applies a predefined bias (e.g., a reset signal RX). When the reset transistor RG is turned on based on the reset signal RX, a predefined electrical potential, for example, the power voltage $V_{DD}$ provided to a drain of the reset transistor RG may be transferred to the floating diffusion area FD.

In an exemplary embodiment of the present inventive concept, as an area of the unit pixel becomes smaller, the elements constituting the unit pixel of FIG. 2 may be composed of two chips. For example, the photoelectric conversion layer PD and the transmit transistor TG may constitute a third chip, while the reset transistor RG, the source follower transistor SF and the select transistor SEL may constitute a fourth chip different from the third chip. The third chip and the fourth chip may be aligned with each other to form a unit pixel.

Figure 3:
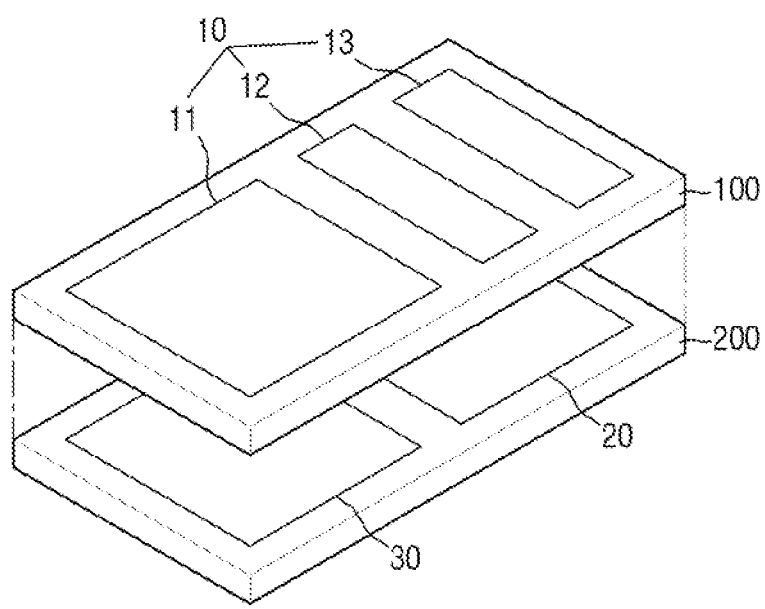
FIG. 3 is a diagram illustrating a conceptual layout of an image sensor according to an exemplary embodiment of the present inventive concept.

FIG. 3 is a diagram illustrating a conceptual layout of an image sensor according to an exemplary embodiment of the present inventive concept.

Referring to FIG. 3, the image sensor according to an exemplary embodiment of the present inventive concept may include a first substrate structure 100 and a second substrate structure 200 as stacked vertically.

In the first substrate structure 100, a plurality of unit pixels may be arranged in a two-dimensional array structure and in a two-dimensional plane. The first substrate structure 100 may include the active pixel sensor array 10. The active pixel sensor array 10 may include a sensor array area 11, a connection area 12, and a pad area 13.

Active pixels which receive light to generate an active signal may be arranged in the sensor array area 11. The connection area 12 may transmit a control signal to the sensor array area 11. Further, the connection area 12 may transmit an output signal of the unit pixel to the second block 20 of the second substrate structure 200. The pad area 13 may be configured to transmit or receive an electrical signal between the image sensor and an external device according to an exemplary embodiment of the present inventive concept.

The second substrate structure 200 may include the second block 20 and a logic area 30, and the like. The second substrate structure 200 may be disposed under the first substrate structure 100. The first substrate structure 100 and the second substrate structure 200 may be electrically connected to each other. The second substrate structure 200 may allow a pixel signal transmitted from the first substrate structure 100 to be transmitted to the logic area 30 of the second substrate structure 200.

For example, the connection area 12 of the active pixel sensor array 10 may be connected to the analog to digital converter (26 of FIG. 1) of the second block 20. The connection area 12 may transmit an output signal of unit pixel to the analog to digital converter 26. The analog to digital converter 26 may convert the output signal to a digital image signal. The image signal may be transmitted to an ISP circuit of the logic area 30. The logic area 30 may process the image signal.

Logic elements may be arranged in the logic area of the second substrate structure 200. The logic elements may be, for example, an ISP circuit. The logic elements may include circuits for processing a pixel signal received from the unit pixels. The logic elements may receive the image signal from the analog-to-digital converter 26 and process the image signal.

Figure 4:
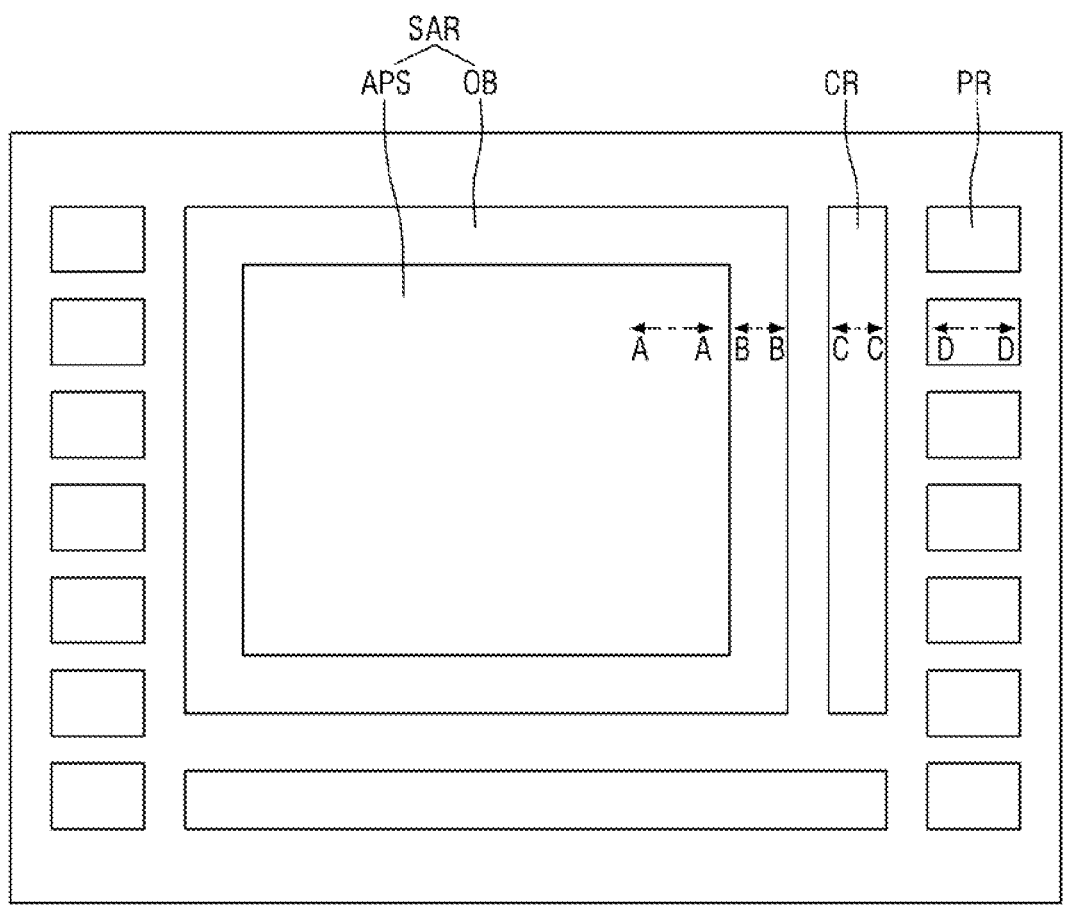
FIG. 4 is a layout diagram illustrating an image sensor according to an exemplary embodiment of the present inventive concept.

FIG. 4 is a layout diagram illustrating an image sensor according to an exemplary embodiment of the present inventive concept. For reference, FIG. 4 may be a plan view of the first substrate structure in which the pixel active sensor array of FIG. 3 is formed.

Referring to FIG. 4, the first substrate structure including the pixel active sensor array according to an exemplary embodiment of the present inventive concept may include a sensor array area SAR, a connection area CR, and a pad area PR.

The sensor array area SAR may include an area corresponding to the active pixel sensor array 10 of FIG. 1 and FIG. 3. For example, a plurality of unit pixels arranged two-dimensionally (e.g., in a matrix form) in a plane may be formed in the sensor array area SAR.

The sensor array area SAR may include an active pixel sensor (e.g., a light receiving area) APS and a light-blocking area OB. In the light-receiving area APS, active pixels that receive light to generate an active signal may be arranged. Optical black pixels which block light to generate an optical black signal may be arranged in the light-blocking area OB. The light-blocking area OB may be formed, for example, at least partially around the light-receiving area APS. However, this is only example, and the present inventive concept is not limited thereto.

The connection area CR may be formed adjacent to the sensor array area SAR. The connection area CR may be the connection area 12 of FIG. 3. The connection area CR may be formed at one side around the sensor array area SAR. However, this is only an example. Lines may be formed in the connection area CR to transmit the control signal to the sensor array area SAR or to transmit the output signal of the unit pixel to the second block 20 of FIG. 3.

The pad area PR may be formed adjacent to the sensor array area SAR. The pad area PR may be the pad area 13 of FIG. 3. The pad area PR may be formed adjacent to an edge of the image sensor according to an exemplary embodiment of the present inventive concept. However, this is only an example. The pad area PR may be connected to an external device and the like, and may be configured to transmit or receive an electrical signal between the image sensor composed of the first substrate structure and the second substrate structure according to an exemplary embodiment of the present inventive concept and the external device.

In an exemplary embodiment of the present inventive concept, the light-receiving area APS may be a first area, the light-blocking area OB may be a second area, and a combination of the connection area CR and the pad area PR may be a third area. For example, the second area may be disposed around at least a portion of the first area, and the third area may be disposed around at least a portion of the second area. However, the present inventive concept is not limited thereto.

Figure 5:
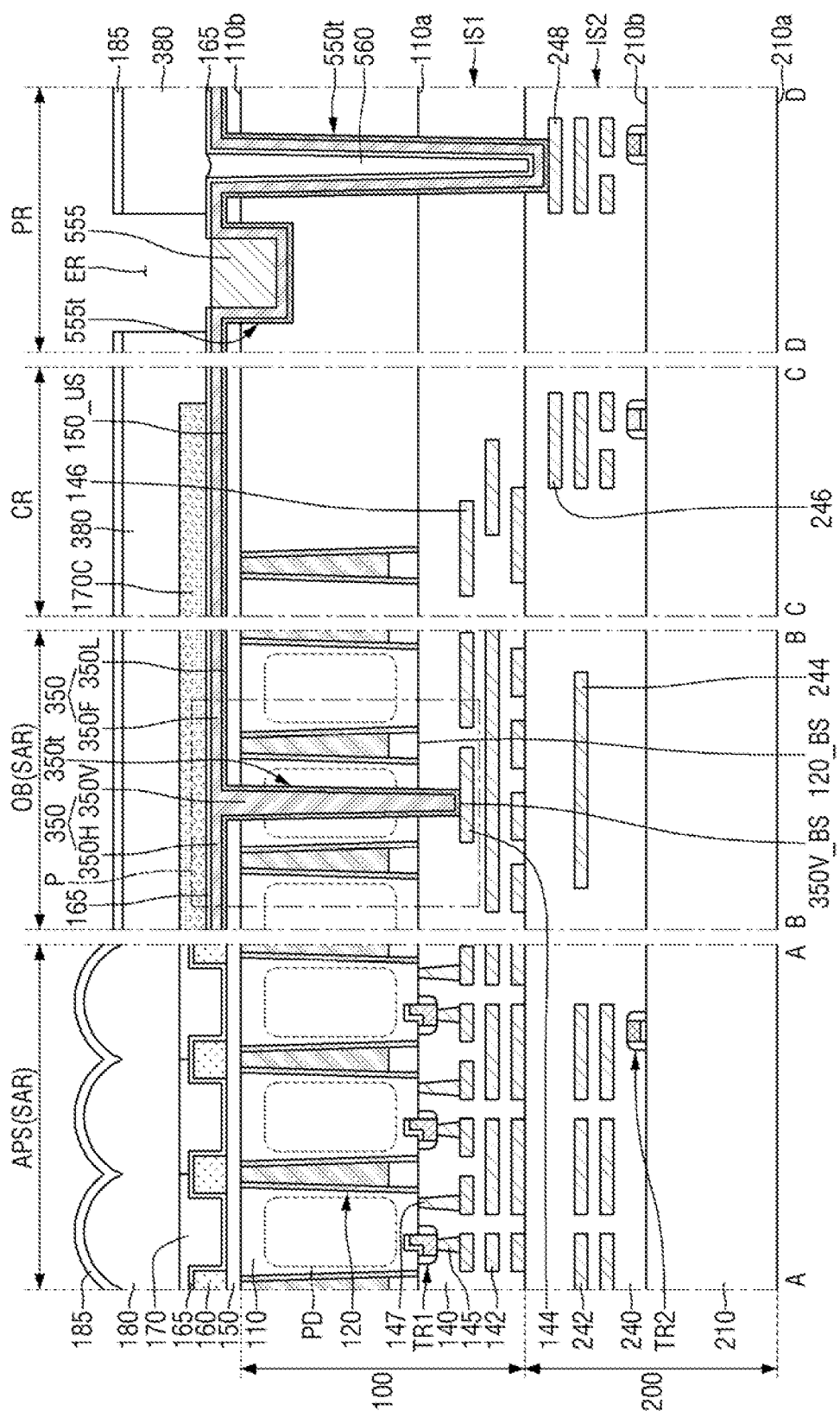
FIG. 5 is a cross-sectional view taken along lines A-A, B-B, C-C, and D-D of FIG. 4.
Figure 6:
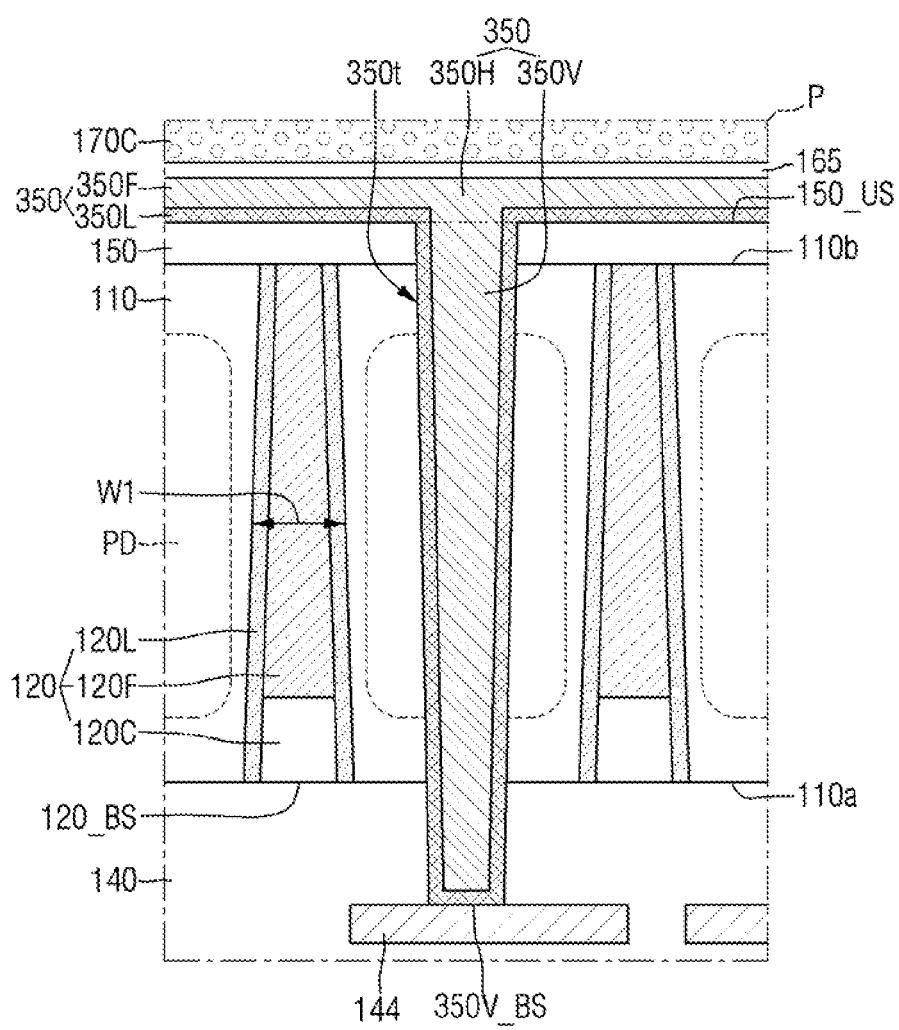
FIG. 6 is an enlarged view of a P area of FIG. 5.

FIG. 5 is a cross-sectional view taken along lines A-A, B-B, C-C, and D-D of FIG. 4. FIG. 6 is an enlarged view of a P area of FIG. 5.

Referring to FIGS. 5 and 6, the image sensor according to an exemplary embodiment of the present inventive concept may include the sensor array area SAR, the connection area CR, and the pad area PR.

The sensor array area SAR may include an area corresponding to the active pixel sensor array 10 of FIG. 1. For example, a plurality of unit pixels arranged two-dimensionally (e.g., in a matrix form) may be formed in the sensor array area SAR.

The sensor array area SAR may include the light-receiving area APS and the light-blocking area OB. In the light-receiving area APS, the active pixels that receive light to generate the active signal may be arranged. The optical black pixels, which may block light to generate the optical black signal, may be arranged in the light-blocking area OB.

In an exemplary embodiment of the present inventive concept, dummy pixels may be formed in a portion of the light-receiving area APS adjacent to the light-blocking area OB. The dummy pixels may refer to pixels that do not generate the active signal.

The connection area CR may be formed adjacent to the sensor array area SAR. The connection area CR may be formed at one side around the sensor array area SAR. However, this is only an example. The lines may be formed in the connection area CR to transmit and receive the electrical signal of the sensor array area SAR.

The pad area PR may be formed adjacent to the sensor array area SAR. The pad area PR may be formed adjacent to the edge of the image sensor according to exemplary embodiment of the present inventive concept. In addition, the connection area CR may be disposed between the pad area PR and the sensor array area SAR. However, this is only an example. The pad area PR may be connected to the external device and the like, and may be configured to transmit and receive the electrical signal between the image sensor according to an exemplary embodiment of the present inventive concept and the external device.

The image sensor according to an exemplary embodiment of the present inventive concept may include a first substrate 110, a pixel defining pattern 120, a first line structure IS1, a second line structure IS2, a second substrate 210, a surface insulating film 150, a first color filter 170, a grid pattern 160, a micro-lens 180, a pad pattern 555, and a light-blocking film 350.

The first substrate 110 may be embodied as a semiconductor substrate. For example, the first substrate 110 may be made of bulk silicon or an SOI (silicon-on-insulator). The first substrate 110 may be embodied as a silicon substrate or may be made of a material other than silicon, such as silicon germanium, indium antimonide, a lead tellurium compound, indium arsenide, indium phosphide, gallium arsenide or gallium antimonide. In addition, the first substrate 110 may include of a base substrate, and an epitaxial layer formed on the base substrate.

The first substrate 110 may include a first face 110a and a second face 110b that opposes the first surface 110a. In an exemplary embodiment of the present inventive concept as described below, the first face 110a may be referred to as a front face of the first substrate 110, while the second face 110b may be referred to as a back face of the first substrate 110. In an exemplary embodiment of the present inventive concept, the second face 110b of the first substrate 110 may act as a light-receiving surface on which light is incident. For example, the image sensor according to an exemplary embodiment of the present inventive concept may be a backside irradiation type (BSI) image sensor.

The plurality of unit pixels may be formed on the first substrate 110 and in the sensor array area SAR. The plurality of pixels as arranged two-dimensionally (for example, in a matrix form) may be formed in the light-receiving area APS.

Each unit pixel may include the photoelectric conversion layer PD. The photoelectric conversion layer PD may be formed in the first substrate 110 and in the light-receiving area APS and the light-blocking area OB. The photoelectric conversion layer PD may generate electric charges in proportion to an amount of light incident thereto from the outside.

The photoelectric conversion layer PD may include, for example, at least one of a photo diode, a photo transistor, a photo gate, a pinned photo diode, an organic photo diode, a quantum dot, and combinations thereof. The present inventive concept is not limited thereto.

A unit pixel within the light-receiving area APS may contain a first electronic element TR1. In an exemplary embodiment of the present inventive concept, the first electronic element TR1 may be formed on the first face 10a of the first substrate 110. The first electronic element TR1 may be connected to the photoelectric conversion layer PD and may constitute each of various transistors for processing the electrical signal. For example, the first electronic element TR1 may be a transistor such as the transmit transistor TG, the reset transistor RG, the source follower transistor SF, or the select transistor SEL as described above with reference to FIG. 2.

In an exemplary embodiment of the present inventive concept, the first electronic element TR1 may include a vertical transmit transistor. For example, a portion of the first electronic element TR1 constituting the above-described transmit transistor TG may extend into the first substrate 110. The transmit transistor TG may reduce an area of the unit pixel, thereby enabling high integration of the image sensor.

The pixel defining pattern 120 may be formed in the first substrate 110 and in the sensor array area SAR. The pixel defining pattern 120 may be formed, for example, by filling a deep trench, which is formed by patterning the first substrate 110, with an insulating material. The pixel defining pattern 120 may extend through the first substrate 110. For example, the pixel defining pattern 120 may extend from the first face 110a to the second face 110b. The pixel defining pattern 120 may act as FDTI (front deep trench isolation). A width W1 of the pixel defining pattern 120 may be reduced as the pixel defining pattern 120 extends away from the first face 110a. The width W1 of the pixel defining pattern 120 is the largest at a portion thereof in contact with the first face 110a of the first substrate 110. The width W1 of the pixel defining pattern 120 is the smallest at a portion thereof in contact with the second face 110b of the first substrate 110.

The pixel defining pattern 120 may define a plurality of unit pixels. The pixel defining pattern 120 may be formed in a grid shape in a plan view to separate the plurality of unit pixels from each other.

The pixel defining pattern 120 may include a pixel defining liner film 120L, a pixel defining filling film 120F and a pixel defining capping film 120C. The pixel defining liner film 120L may be disposed along each of side walls of the pixel defining pattern 120. The pixel defining filling film 120F may be disposed between adjacent opposing pixel defining liner films 120L. The pixel defining capping film 120C may be disposed on the pixel defining filling film 120F. A top face of the pixel defining filling film 120F may be a top surface of the pixel defining pattern 120. A bottom face of the pixel defining capping film 120C may be a bottom surface 120_BS of the pixel defining pattern 120.

The pixel defining liner film 120L may include an oxide film having a lower refractive index than that of the first substrate 110. For example, the pixel defining liner film 120L may include at least one of silicon oxide, aluminum oxide, tantalum oxide, or combinations thereof. The present inventive concept is not limited thereto. The pixel defining liner film 120L which has a lower refractive index than that of the first substrate 110 may refract or reflect light obliquely incident to the photoelectric conversion layer PD. Further, the pixel defining liner film 120L may prevent the photocharges generated in a specific unit pixel using the incident light from moving to a unit pixel adjacent thereto via random drift. For example, the pixel defining liner film 120L may increase a light-receiving ability of the photoelectric conversion layer PD to increase quality of the image sensor according to an exemplary embodiment of the present inventive concept.

In an exemplary embodiment of the present inventive concept, the pixel defining filling film 120F may include a conductive material. For example, the pixel defining filling film 120F may include polysilicon (poly Si). The present inventive concept is not limited thereto. In an exemplary embodiment of the present inventive concept, a ground voltage or a negative voltage may be applied to the pixel defining filling film 120F including the conductive material. Accordingly, an ESD (electrostatic discharge) bruise defect of the image sensor according to an exemplary embodiment of the present inventive concept may be prevented. In this connection, the ESD bruise defect refers to a phenomenon in which electric charges generated due to the ESD, etc. accumulate on a surface (e.g., the second face 110b) of the first substrate 110, thereby causing a stain such as a bruise on a generated image.

In an exemplary of the present inventive concept, the pixel defining capping film 120C may include an insulating material. For example, the pixel defining capping film 120C may include, but is not limited to, an oxide-based insulating material.

The first line structure IS1 may be formed on the first substrate 110. For example, the first line structure IS1 may cover the first face 110a of the first substrate 110. The first substrate 110 and the first line structure IS1 may form the first substrate structure 100.

The first line structure IS1 may include one wire pattern or a plurality of wire patterns. For example, the first line structure IS1 may include a first interline insulating film 140, a plurality of wire patterns 142, 144, and 146, and a plurality of contacts 145 and 147 in the first interline insulating film 140. In FIG. 5, the number of layers of the wire patterns constituting the first line structure IS1 and an arrangement thereof are merely examples. The first interline insulating film 140 may include, for example, at least one of silicon oxide, silicon nitride, silicon oxynitride and a low-k material having a lower dielectric constant than that of silicon oxide. The present inventive concept is not limited thereto.

In an exemplary embodiment of the present inventive concept, the first line structure IS1 may include the first wire pattern 142 in the light-receiving area APS, the second wire pattern 144 in the light-blocking area OB, and the third wire pattern 146 in the connection area CR.

The first wire pattern 142 may be electrically connected to a unit pixel in the light-receiving area APS. For example, the first wire pattern 142 may be connected to the first electronic element TR1. The second wire pattern 144 may extend from the light-receiving area APS. The third wire pattern 146 may extend from the sensor array area SAR. For example, the first wire pattern 142, the second wire pattern 144, and the third wire pattern 146 may be electrically connected to each other. Accordingly, the third wire pattern 146 may be electrically connected to the unit pixel in the sensor array area SAR.

In an exemplary embodiment of the present inventive concept, the second wire pattern 144 may be electrically connected to a portion of the light-blocking film 350 in the light-blocking area OB. A ground voltage or a negative voltage may be applied to the light-blocking film 350 including the conductive material. A ground voltage or a negative voltage may be applied to the light-blocking film 350 using the second wire pattern 144. Accordingly, the ESD (electrostatic discharge) bruise defect of the image sensor according to exemplary embodiment of the present inventive concept may be prevented. In this connection, the ESD bruise defect refers to a phenomenon in which electric charges generated by ESD, etc. accumulate on the surface of the substrate, for example, the second face 110b of the first substrate 110, thereby causing a stain such as a bruise on the generated image.

Each of the first wire pattern 142, the second wire pattern 144, and the third wire pattern 146 may include, for example, at least one of tungsten (W), copper (Cu), aluminum (Al), gold (Au), silver (Ag), and alloys thereof. The present inventive concept is not limited thereto.

In an exemplary embodiment of the present inventive concept, the first contact 145 may be connected to the first electronic element TR1. The second contact 147 may be connected to the first substrate 110. The second contacts 147 may be respectively connected to source/drain areas.

Each of the first contact 145, and the second contact 147 may include, for example, at least one of tungsten (W), copper (Cu), aluminum (Al), gold (Au), silver (Ag), and alloys thereof. The present inventive concept is not limited thereto.

The second substrate 210 may be made of bulk silicon or SOI (silicon-on-insulator). The second substrate 210 may include a silicon substrate, or may be made of a material other silicon, such as silicon germanium, indium antimonide, a lead tellurium compound, indium arsenide, indium phosphide, gallium arsenide or gallium antimonide. In addition, the second substrate 210 may include a base substrate and an epitaxial layer formed on the base substrate.

The second substrate 210 may include a third surface 210a and a fourth surface 210b opposite to each other. In an exemplary embodiment of the present inventive concept, the fourth surface 210b of the second substrate 210 may be a surface facing toward the first surface 110a of the first substrate 110.

A plurality of electronic elements may be formed on the second substrate 210. For example, the second electronic element TR2 may be formed on the fourth surface 210b of the second substrate 210. The second electronic element TR2 may be electrically connected to the sensor array area SAR, and may transmit and receive an electrical signal to and from each unit pixel of the sensor array area SAR. For example, the second electronic element TR2 may include an electronic element forming the row decoder 20, the row driver 30, the column decoder 40, the timing generator 50, the correlated double sampler 60, the analog to digital converter 70 or the input/output buffer 80 in FIG. 1.

The second line structure IS2 may be formed on the second substrate 210. For example, the second line structure IS2 may cover the fourth surface 210b of the second substrate 210. The second substrate 210 and the second line structure IS2 may form the second substrate structure 200.

The second line structure IS2 may be attached to the first line structure IS1. For example, as shown in FIG. 5, a top surface of the second line structure IS2 may be attached to a bottom surface of the first line structure IS1. For example, a bottom surface of the first interline insulating film 140 and a top surface of the second interline insulating film 240 may be bonded to each other.

The second line structure IS2 may include one wire pattern or a plurality of wire patterns. For example, the second line structure IS2 may include a second interline insulating film 240 and a plurality of wire patterns 242, 244, 246, and 248 in the second interline insulating film 240. In FIG. 5, the number of layers of the wire patterns forming the second line structure IS2 and the arrangement thereof are merely examples. The present inventive concept is not limited thereto. The second interline insulating film 240 may include, for example, at least one of silicon oxide, silicon nitride, silicon oxynitride or a low-k material having a dielectric constant lower than that of silicon oxide. The present inventive concept is not limited thereto. In an exemplary embodiment of the present inventive concept, the second line structure IS2 may include the same material as that of the first line structure IS1.

At least one of the wire patterns 242, 244, 246, and 248 of the second line structure IS2 may be connected to the second electronic element TR2. In an exemplary embodiment of the present inventive concept, the second line structure IS2 may include the fourth wire pattern 242 in the light-receiving area APS, the fifth wire pattern 244 in the light-blocking area OB, the sixth wire pattern 246 in the connection area CR, and the seventh wire pattern 248 in the pad area PR. In an exemplary embodiment of the present inventive concept, the sixth wire pattern 246 may be an uppermost wire pattern among the plurality of wire patterns in the connection area CR. The seventh wire pattern 248 may be an uppermost wire pattern among the plurality of wire patterns in the pad area PR.

Each of the fourth wire pattern 242, the fifth wire pattern 244, the sixth wire pattern 246, and the seventh wire pattern 248 may include, for example, at least one of tungsten (W), copper (Cu), aluminum (Al), gold (Au), silver (Ag), and alloys thereof. The present inventive concept is not limited thereto.

The surface insulating film 150 may be formed on the second surface 110b of the first substrate 110. The surface insulating film 150 may extend along the second surface 110b of the first substrate 110. In an exemplary embodiment of the present inventive concept, at least a portion of the surface insulating film 150 may contact the pixel defining pattern 120.

The surface insulating film 150 may include an insulating material. For example, the surface insulating film 150 may include at least one of silicon oxide, silicon nitride, silicon oxynitride, aluminum oxide, hafnium oxide, or combinations thereof. The present inventive concept is not limited thereto.

The surface insulating film 150 may function as an anti-reflection film, thereby preventing reflection of light incident to the first substrate 110, thereby increasing the light-receiving ability of the photoelectric conversion layer PD. Further, the surface insulating film 150 may function as a planarization film, such that the first color filters 170 may have a uniform vertical dimension and the micro-lenses 180 may have a uniform vertical dimension.

The first color filters 170 may be formed on the surface insulating film 150 and in the light-receiving area APS. In an exemplary embodiment of the present inventive concept, the first color filters 170 may be arranged in a corresponding manner to the unit pixels, respectively. For example, the plurality of first color filters 170 may be arranged two-dimensionally (e.g., in a matrix form).

The first color filters 170 may include various color filters depending on unit pixels. For example, the first color filters 170 may be arranged in a bayer pattern including a red color filter, a green color filter, and a blue color filter. However, this is only an example. The first color filters 170 may include a yellow filter, a magenta filter and a cyan filter, and may further include a white filter.

The grid pattern 160 may be formed on the surface insulating film 150. The grid pattern 160 may be formed in a grid shape from a plan view and may be interposed between the plurality of first color filters 170. For example, the grid pattern 160 may include openings exposing the surface insulating film 150. For example, the boundaries between the first color filters 170 may overlap the grid patterns 160.

The grid pattern 160 may include a low refractive index material having a refractive index lower than that of silicon (Si). For example, the grid pattern 160 may include at least one of silicon oxide, aluminum oxide, tantalum oxide, or combinations thereof. The present inventive concept is not limited thereto. The grid pattern 160 including the low refractive index material may refract or reflect light obliquely incident to the image sensor to increase the quality of the image sensor.

In an exemplary embodiment of the present inventive concept, the first protective film 165 may be formed on the surface insulating film 150 and the grid pattern 160. The first protective film 165 may be interposed between the surface insulating film 150 and the first color filter 170 and between the grid pattern 160 and the first color filter 170. For example, the first protective film 165 may extend along profiles of a top face of the surface insulating film 150, and side faces and a top face of the grid pattern 160.

The first protective film 165 may include, for example, aluminum oxide. The present inventive concept is not limited thereto. The first protective film 165 may prevent damage to the surface insulating film 150 and the grid pattern 160.

The micro-lenses 180 may be formed on the first color filter 170. The micro-lenses 180 may be arranged in a corresponding manner to the unit pixels, respectively. For example, the micro-lenses 180 may be arranged two-dimensionally (e.g., in a matrix form) in a plane.

Each of the micro-lenses 180 has a convex shape and may have a predefined radius of curvature. Accordingly, incident light on the micro-lens 180 may be condensed onto the photoelectric conversion layer PD. The micro-lens 180 may include, for example, a light-transmissive resin. The present inventive concept is not limited thereto.

In an exemplary embodiment of the present inventive concept, the second protective film 185 may be formed on the micro-lenses 180. The second protective film 185 may extend along surfaces of the micro-lenses 180. The second protective film 185 may include, for example, an inorganic oxide film. For example, the second protective film 185 may include at least one of silicon oxide, titanium oxide, zirconium oxide, hafnium oxide, or combinations thereof. The present inventive concept is not limited thereto. In an exemplary embodiment of the present inventive concept, the second protective film 185 may include a low-temperature oxide (LTO).

The second protective film 185 may protect the micro-lenses 180 from the outside. For example, the second protective film 185 may include an inorganic oxide film to protect the micro-lenses 180 including an organic material. Further, the second protective film 185 may increase condensing ability of the micro-lens 180. For example, the second protective film 185 may fill a space between the micro-lenses 180 to reduce reflection, refraction, and scattering of the incident light reaching the space between the micro-lenses 180.

The light-blocking film 350 may be formed in the light-blocking area OB. The light-blocking film 350 may extend to the connection area CR and the pad area PR. The light-blocking film 350 may be disposed on the first substrate 110. The light-blocking film 350 may be disposed on the surface insulating film 150. The light-blocking film 350 may extend along a top surface 150_US of the surface insulating film 150. The light-blocking film 350 may extend along the top surface 150_US of the surface insulating film 150 and thus may be formed in the light-blocking area OB, the connection area CR and the pad area PR.

In an exemplary embodiment of the present inventive concept, the light-blocking film 350 may include a horizontal light-blocking film 350H and a vertical light-blocking film 350V. The horizontal light-blocking film 350H may extend along the top surface 150_US of the surface insulating film 150. The vertical light-blocking film 350V may extend through the surface insulating film 150 and the first substrate 110. The vertical light-blocking film 350V may separate adjacent portions of the pixel defining pattern 120 from each other. For example, the vertical light-blocking film 350V may be disposed between adjacent portions of the pixel defining pattern 120. For example, the pixel defining pattern 120 may be formed in a grid shape. When the vertical light-blocking film 350V may extend in one direction, the vertical light-blocking film 350V may separate adjacent portions of the pixel defining pattern 120 from each other. In this case, the vertical light-blocking film 350V may be electrically connected to the pixel defining pattern 120. The vertical light-blocking film 350V may be electrically connected to the pixel defining filling film 120F of the pixel defining pattern 120. Accordingly, when a bias voltage or a negative voltage is applied to the vertical light-blocking film 350V, the bias voltage or the negative voltage may be applied to the pixel defining pattern 120.

The horizontal light-blocking film 350H may extend along the top face 150_US of the surface insulating film 150 and into the pad area PR. The horizontal light-blocking film 350H may be electrically connected to the pad pattern 555 of the pad area PR. In the light-blocking area OB, a trench exposing the pixel defining pattern 120 may be formed. The horizontal light-blocking film 350H may extend along a side wall and a bottom face of the trench. The horizontal light-blocking film 350H may be connected to a portion of the pixel defining pattern 120. For example, the light-blocking film 350 may be electrically connected to the pixel defining pattern 120. The light-blocking film 350 may be electrically connected to the pixel defining filling film 120F of the pixel defining pattern 120. Accordingly, when a bias voltage or a negative voltage is applied to the light-blocking film 350, the bias voltage or the negative voltage may be applied to the pixel defining pattern 120.

The vertical light-blocking film 350V may fill a first trench 350t. The first trench 350t may extend through the first substrate 110. The vertical light-blocking film 350V may pass through the first substrate 110 and be electrically connected to the second wire pattern 144. A vertical level of a bottom face 350V_BS of the vertical light-blocking film 350V may be lower than that of the bottom face 120_BS of the pixel defining pattern 120. In a process of forming the first trench 350t, a portion of the first interline insulating film 140 may be etched. In a process of forming the first trench 350t, the second wire pattern 144 may be used as an etching stop film. For example, the bottom face 350V_BS of the vertical light-blocking film 350V may be in contact with the second wire pattern 144.

In an exemplary embodiment of the present inventive concept, a bias voltage or a negative voltage may be applied to the vertical light-blocking film 350V via the second wire pattern 144. The vertical light-blocking film 350V may be electrically connected to the horizontal light-blocking film 350H, and the pixel defining filling film 120F. Accordingly, the bias voltage or the negative voltage applied to the vertical light-blocking film 350V may be applied to the pixel defining filling film 120F of the pixel defining pattern 120. Therefore, the charges generated by the ESD, etc. may be discharged to the light-blocking film 350 via the pixel defining pattern 120, such that the ESD bruise defect may be prevented.

The light-blocking film 350 may prevent light from being incident into the unit pixel in the light-blocking area OB. For example, the horizontal light-blocking film 350H may prevent light from being incident toward the second face 110b of the first substrate 110. The vertical light-blocking film 350V may prevent light obliquely reflected from the first face 110a of the first substrate 110 from being incident to a neighboring unit pixel.

In an exemplary embodiment of the present inventive concept, a width of the vertical light-blocking film 350V may be smaller than a width of the photoelectric conversion layer PD. The vertical light-blocking film 350V may be interposed between adjacent portions of the pixel defining pattern 120. However, the present inventive concept is not limited thereto.

In an exemplary embodiment of the present inventive concept, the light-blocking film 350 may include a light-blocking liner film 350L and a light-blocking filling film 350F. The light-blocking liner film 350L may be formed along a top face of the surface insulating film 150, a side wall and a bottom face of the first trench 350t, a side wall and a bottom face of a second trench 550t, and a side wall and a bottom face of a third trench 555t. The light-blocking filling film 350F may be formed on the light-blocking liner film 350L. The light-blocking liner film 350L and the light-blocking filling film 350F may be formed conformally to each other. For example, the light-blocking filling film 350L may have a shape similar to that of the light-blocking liner film 350L. The present inventive concept is not limited thereto.

The light-blocking liner film 350L may include, for example, titanium (Ti), titanium nitride (TiN), titanium silicon nitride (TiSiN), or a combination thereof. The present inventive concept is not limited thereto. The light-blocking filling film 350F may include, for example, tungsten (W). The present inventive concept is not limited thereto.

In an exemplary embodiment of the present inventive concept, a second color filter 170C may be disposed on the second face 110b of the first substrate 110 and in the light-blocking area OB and the connection area CR. The second color filter 170C may be formed to cover at least a portion of the first protective film 165 in the light-blocking area OB and the connection area CR. The second color filter 170C may be formed to cover at least a portion of the light-blocking film 350 in the light-blocking area OB and the connection area CR. The second color filter 170C may include, for example, a blue color filter. The present inventive concept is not limited thereto.

In an exemplary embodiment of the present inventive concept, a third protective film 380 may be formed on the second color filter 170C. For example, the third protective film 380 may be formed to cover at least a portion of the first protective film 165 in the light-blocking area OB and the connection area CR. In an exemplary embodiment of the present inventive concept, the second protective film 185 may extend along a surface of the third protective film 380. For example, the second protective film 185 may extend along a top surface of the third protective film 380. The third protective film 380 may include, for example, a light-transmissive resin. The present inventive concept is not limited thereto. In an exemplary embodiment of the present inventive concept, the third protective film 380 may include the same material as that of the micro-lens 180.

In an exemplary embodiment of the present inventive concept, the light-blocking film 350 may extend to the pad area PR. The light-blocking film 350 may be formed on the surface insulating film 150 and in the pad area PR. The light-blocking film 350 of the pad area PR may electrically connect the second substrate structure 200 and an external device to each other.

For example, the second trench 550t exposing the seventh wire pattern 248 may be formed in the first substrate structure 100 and the second substrate structure 200 and in the pad area PR. A portion of the light-blocking film 350 in the pad area PR may be formed in the second trench 550t and may contact the seventh wire pattern 248. The portion of the light-blocking film 350 in the pad area PR may be disposed along the side wall and the bottom face of the second trench 550t.

Further, the third trench 555t may be formed in the first substrate 110 and in the pad area PR. The portion of the light-blocking film 350 in the pad area PR may be formed in the third trench 555t. The portion of the light-blocking film 350 in the pad area PR may extend along the side wall and bottom face of the third trench 555t.

In an exemplary embodiment of the present inventive concept, a filling insulating film 560 filling the second trench 550t may be formed on the light-blocking film 350. The filling insulating film 560 may include, for example, at least one of silicon oxide, aluminum oxide, tantalum oxide, or combinations thereof. Further, the filling insulating film 560 may include a carbon (c)-based material. However, the present inventive concept is not limited thereto.

In an exemplary embodiment of the present inventive concept, the pad pattern 555 filling the third trench 555t may be formed on the light-blocking film 350. The pad pattern 555 may include, for example, at least one of tungsten (W), copper (Cu), aluminum (Al), gold (Au), silver (Ag), or alloys thereof. The present inventive concept is not limited thereto.

In FIG. 5, the light-blocking film 350 may extend along the top face 150_US of the surface insulating film 150 and in the light-blocking area OB, the connection area CR and the pad area PR. The light-blocking film 350 may be electrically connected to the pad pattern 555. For example, the pad pattern 555 is disposed on the light blocking film 350 in the third trench 555t. A bias voltage or a negative voltage may be applied to the light-blocking film 350 via the pad pattern 555. The light-blocking film 350 may be electrically connected to the pixel defining pattern 120. Accordingly, the bias voltage or the negative voltage applied to the pad pattern 555 may be applied to the pixel defining pattern 120. Accordingly, the charges generated by the ESD, etc. may be discharged to the light-blocking film 350 via the pixel defining pattern 120 such that the ESD bruise defect may be prevented.

In an exemplary embodiment of the present inventive concept, the second protective film 185 and the third protective film 380 may expose the pad pattern 555. For example, each of the second protective film 185 and the third protective film 380 may have an exposure opening ER exposing the pad pattern 555 therethrough. Accordingly, the pad pattern 555 may be connected to the external device and the like, and thus may be configured to transmit or receive an electrical signal between the image sensor according to an exemplary embodiment of the present inventive concept and the external device.

As the image sensor has high integration, a size of the unit pixel is increasingly smaller. Accordingly, occurrence of defects due to dark current or charge accumulation at an interface is increasing. For example, an ESD bruise defect may occur in which a bruise-like stain occurs on the generated image due to the accumulation of electric charges generated by ESD, etc. on the surface of the substrate, for example, the second surface 110b of the substrate.

To reduce the ESD bruise defect, the vertical light-blocking film 350V extending through the surface insulating film 150 and the first substrate 110 may be formed. The vertical light-blocking film 350V may reduce the ESD bruise defect, and block light incident to the light-blocking area OB. Therefore, the image sensor according to an exemplary embodiment of the present inventive concept may have the vertical light-blocking film 350V to increase performance and reliability of the image sensor.

Figure 7:
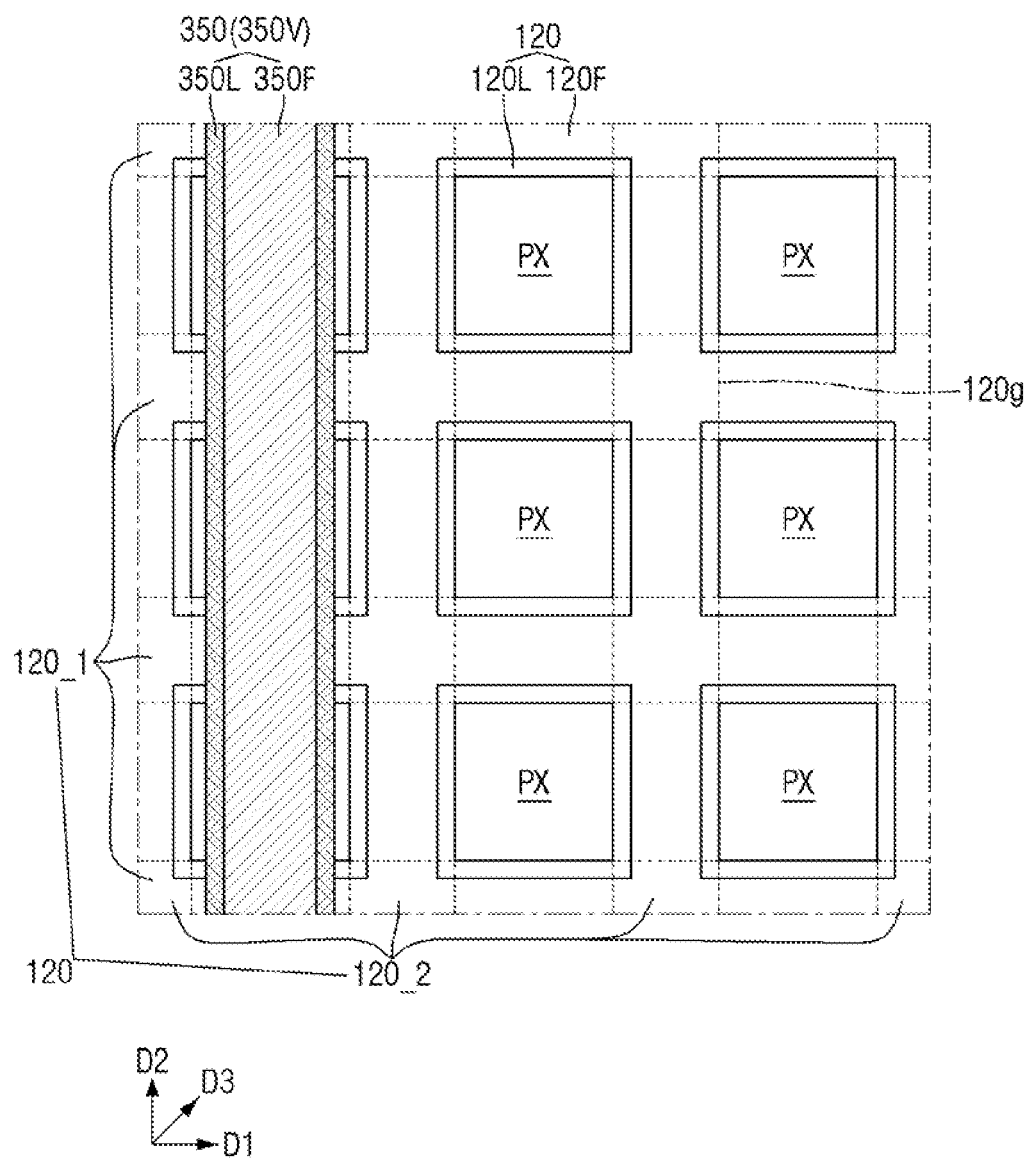
FIG. 7 is a plan view illustrating a vertical light-blocking film and the pixel defining pattern of FIG. 5.

FIG. 7 is a plan view illustrating the vertical light-blocking film and the pixel defining pattern of FIG. 5.

Referring to FIG. 7, the pixel defining pattern 120 may be formed in a grid shape in a plan view including a first direction D1 and a second direction D2 to separate a plurality of unit pixels PXs from each other. The pixel defining pattern 120 may define the unit pixels PX. The first direction D1 and the second direction D2 may intersect each other.

The pixel defining liner film 120L of the pixel defining pattern 120 may be formed around the unit pixel PX. For example, the pixel defining liner film 120L may at least partially surround the unit pixel PX. The pixel defining filling film 120F of the pixel defining pattern 120 may be disposed between adjacent pixel defining liner films 120L. For example, the pixel defining filling film 120F of the pixel defining pattern 120 may be disposed between adjacent unit pixels PX.

The pixel defining pattern 120 may include a plurality of first pixel defining lines 120_1 and a plurality of second pixel defining lines 120_2. The first pixel defining line 1201 may extend in the first direction D1. The second pixel defining line 1202 may extend in the second direction D2. The first pixel defining line 120_1 and the second pixel defining line 1202 may intersect each other. The pixel defining pattern 120 may include a grid point 120g. The grid point 120g may refer to an area where the first pixel defining line 1201 and the second pixel defining line 120_2 intersect with each other.

In an exemplary embodiment of the present inventive concept, the vertical light-blocking film 350V may separate adjacent portions of the pixel defining pattern 120 from each other and may separate or divide the unit pixel PX. For example, the vertical light-blocking film 350V may extend in the second direction D2 in a plan view including the first direction D1 and the second direction D2. The vertical light-blocking film 350V may extend in the second direction D2 to separate the first pixel defining line 120_1.

A width of the vertical light-blocking film 350V may be smaller than that of unit pixel PX. The vertical light-blocking film 350V might not separate the second pixel defining line 120_2. For example, the vertical light-blocking film 350V might not occupy the grid point 120g of the pixel defining pattern 120 in a plan view.

Figure 8:
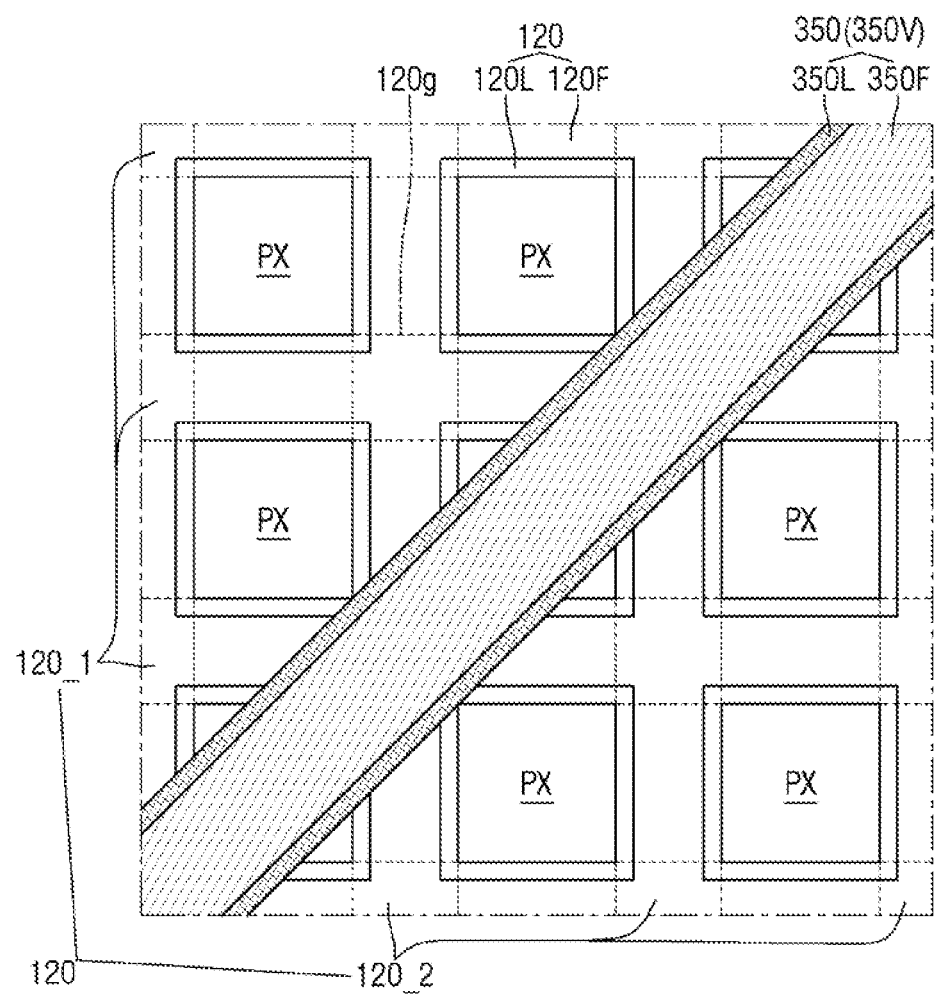
FIG. 8 is a plan view illustrating an image sensor according to an exemplary embodiment of the present inventive concept.

FIG. 8 is a plan view illustrating an image sensor according to an exemplary embodiment of the present inventive concept. For convenience of description, following descriptions are based on differences therefor from the descriptions of FIGS. 1 to 7. In addition, to the extent that the description of various elements are omitted, it may be assumed that these elements are at least similar to corresponding elements that have already been described. For reference, FIG. 8 may be a diagram illustrating the vertical light-blocking film and the pixel defining pattern.

Referring to FIG. 8, the vertical light-blocking film 350V may extend in a third direction D3 in the plan view. The third direction D3 may be different from the first direction D1 and the second direction D2. For example, the third direction D3 may be any direction between the first direction D1 and the second direction D2. Although the third direction D3 is shown to extend at about 45° herein, the present inventive concept is not limited thereto.

The vertical light-blocking film 350V may separate each of the first pixel defining line 120_1 and the second pixel defining line 120_2. For example, the vertical light-blocking film 350V may extend in the third direction D3 to separate each of the first pixel defining line 120_1 and the second pixel defining line 120_2. The vertical light-blocking film 350V may occupy or overlap the grid points 120g of the pixel defining pattern 120 in a plan view.

Figure 9:
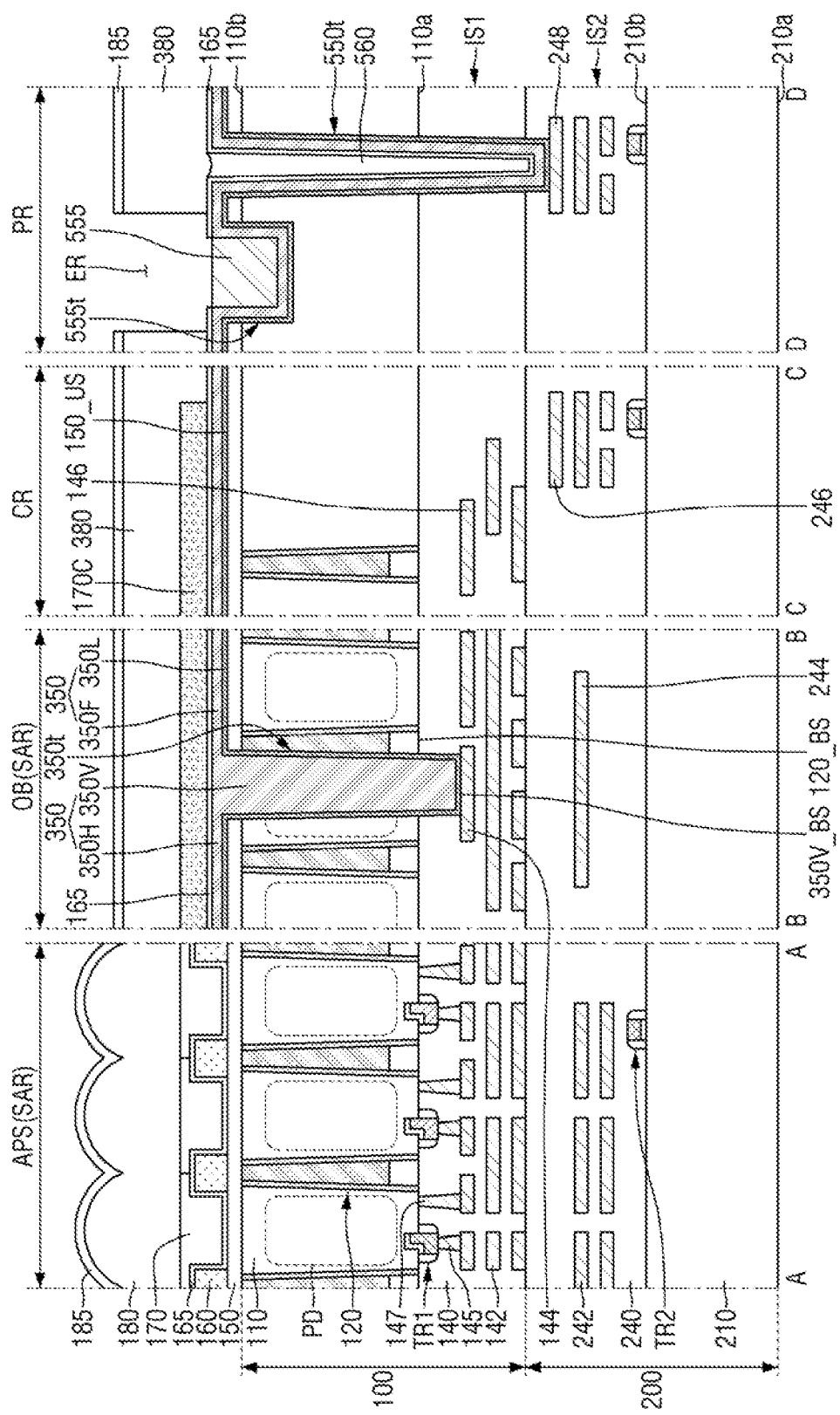
FIG. 9 is a cross-sectional view illustrating an image sensor according to an exemplary embodiment of the present inventive concept.
Figure 10:
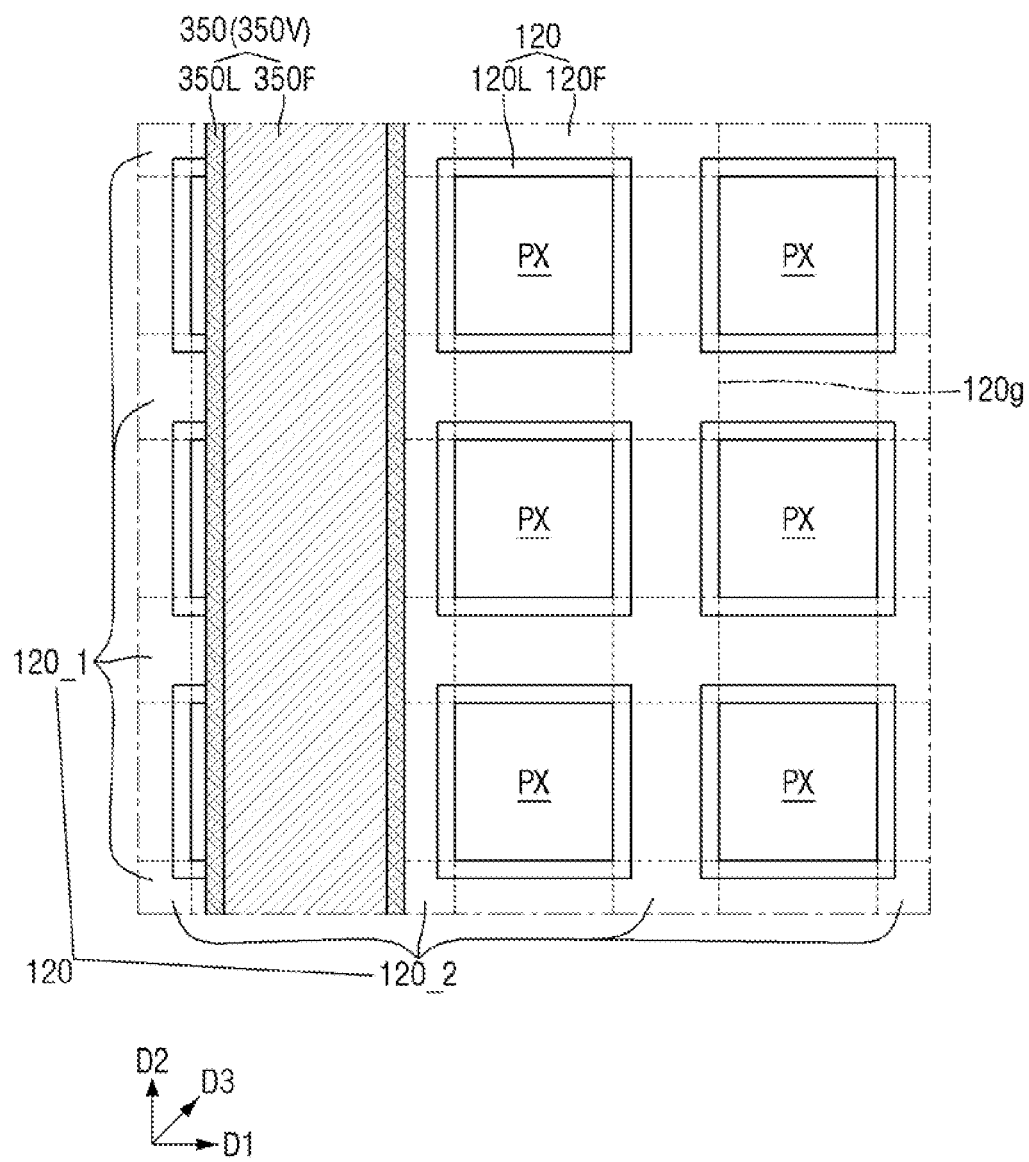
FIG. 10 is a plan view illustrating a vertical light-blocking film and a pixel defining pattern of FIG. 9.

FIG. 9 is a cross-sectional view illustrating an image sensor according to an exemplary embodiment of the present inventive concept. FIG. 10 is a plan view illustrating a vertical light-blocking film and a pixel defining pattern of FIG. 9. For reference, FIG. 9 may be a cross-sectional view taken along the lines A-A, B-B, C-C, and D-D of FIG. 4. For convenience of description, following descriptions are based on differences therefor from the descriptions using FIGS. 1 to 7. In addition, to the extent that the description of various elements are omitted, it may be assumed that these elements are at least similar to corresponding elements that have already been described.

Referring to FIG. 9 and FIG. 10, the vertical light-blocking film 350V may occupy or overlap the grid points 120g of the pixel defining pattern 120 in a plan view.

The vertical light-blocking film 350V may extend in the second direction D2 and allow a width of one second pixel defining line 120_2 to be smaller than that of each of other second pixel defining lines 120_2. For example, the one second pixel defining line 1202 may be adjacent to the vertical light-blocking film 350V, and the width of the one second pixel defining line 120_2 may be smaller than that of each of other second pixel defining lines 120_2. In a plan view, the vertical light-blocking film 350V does not occupy (or, e.g., overlap) an entirety of the second pixel defining line 120_2. The vertical light-blocking film 350V may occupy (or, e.g., overlap) a portion of the second pixel defining line 120_2. The vertical light-blocking film 350V does not occupy (or, e.g., overlap) an entirety of the grid point 120g of the pixel defining pattern 120. The vertical light-blocking film 350V may occupy (or, e.g., overlap) a portion of grid point 120g of pixel defining pattern 120.

Figure 11:
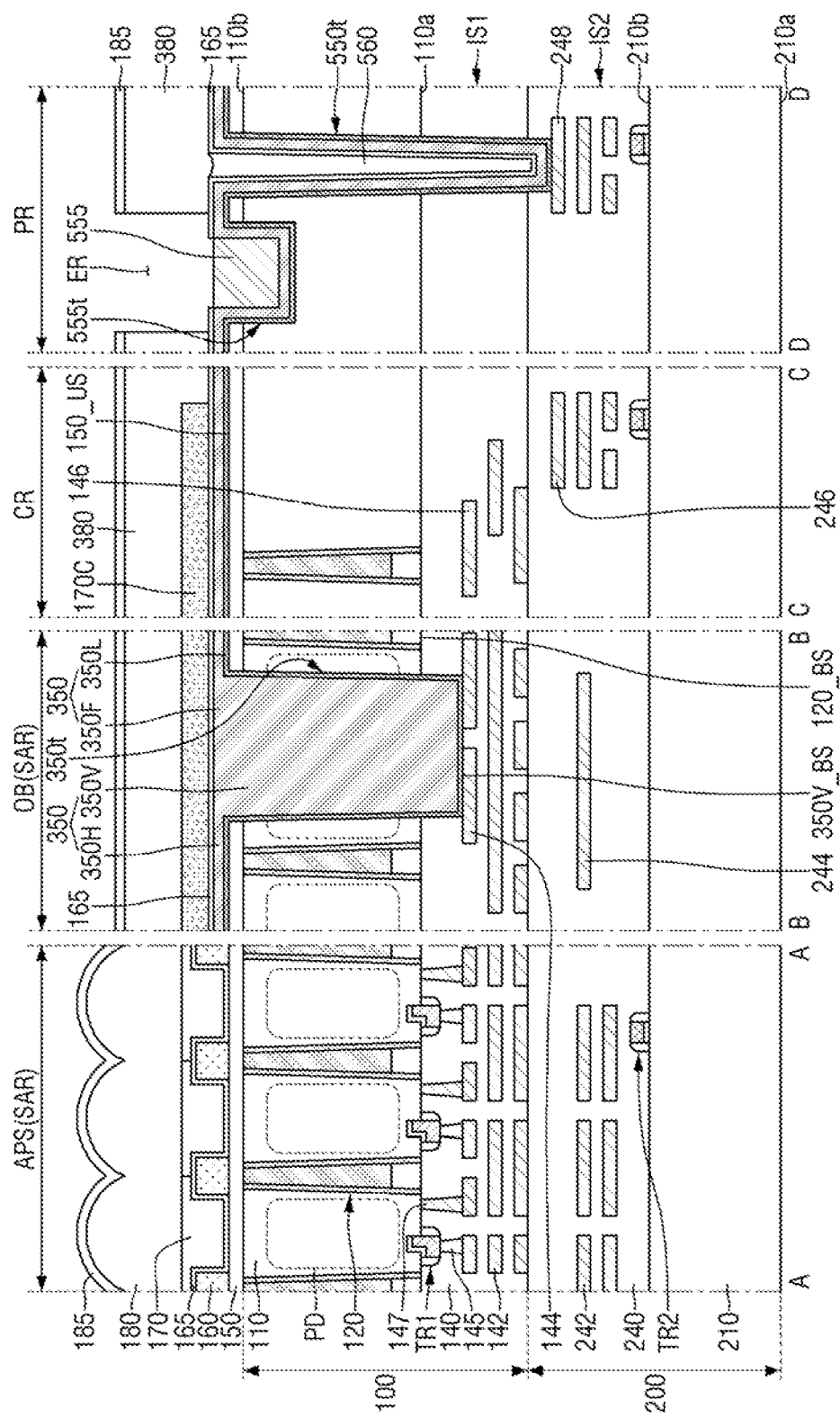
FIG. 11 is a cross-sectional view illustrating an image sensor according to an exemplary embodiment of the present inventive concept.
Figure 12:
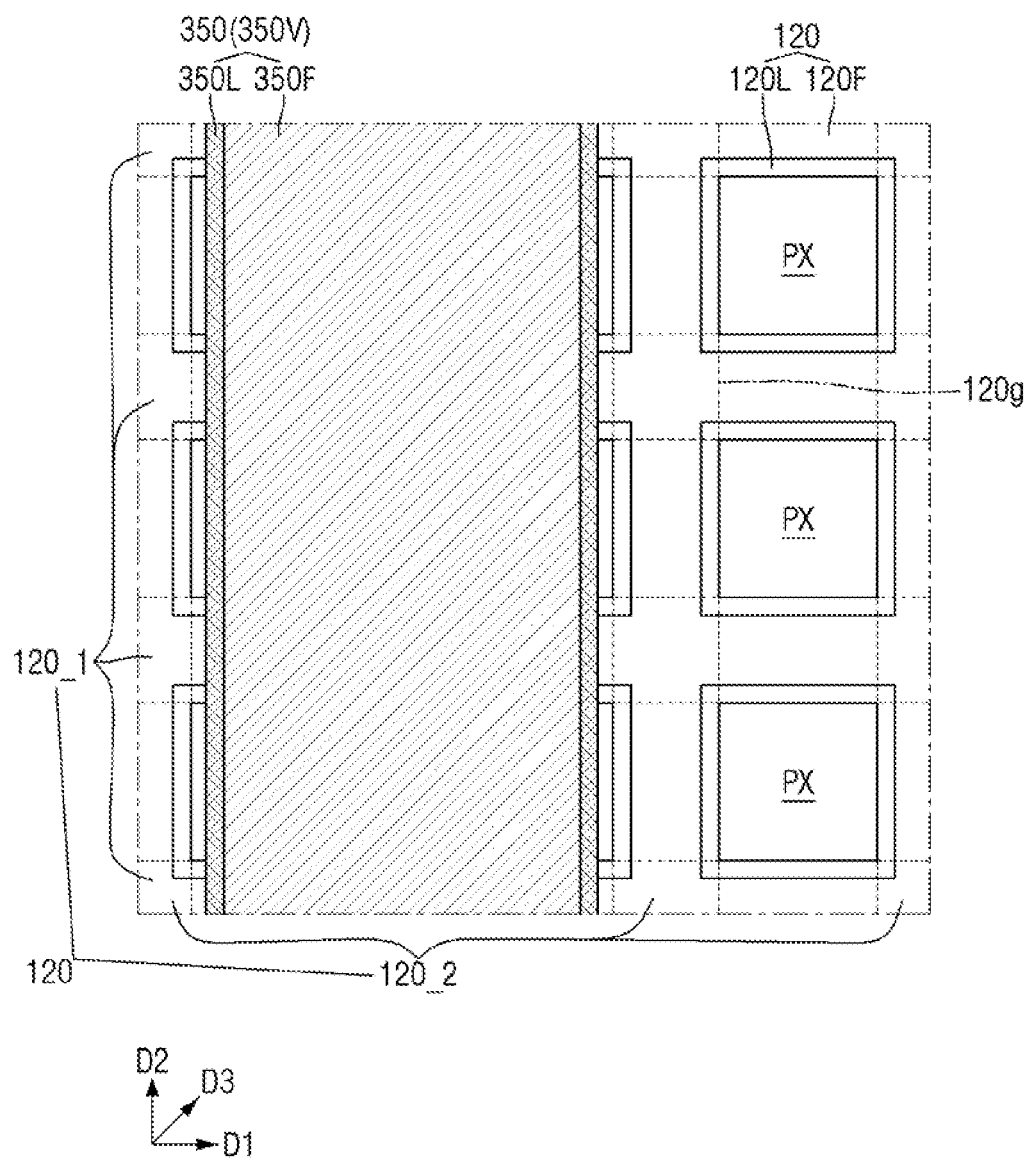
FIG. 12 is a plan view illustrating a vertical light-blocking film and a pixel defining pattern of FIG. 11.

FIG. 11 is a cross-sectional view illustrating an image sensor according to an exemplary embodiment of the present inventive concept. FIG. 12 is a plan view illustrating a vertical light-blocking film and a pixel defining pattern of FIG. 11. For reference, FIG. 11 may be a cross-sectional view taken along the lines A-A, B-B, C-C, and D-D of FIG. 4. For convenience of description, following descriptions are based on differences therefor from the descriptions using FIGS. 1 to 7. In addition, to the extent that the description of various elements are omitted, it may be assumed that these elements are at least similar to corresponding elements that have already been described.

Referring to FIG. 11 and FIG. 12, the vertical light-blocking film 350V may occupy (or, e.g., overlap) an entirety of one second pixel defining line 1202 of the pixel defining pattern 120 in the plan view. For example, a width of the vertical light-blocking film 350V may be larger than a width of the unit pixel PX. For example, the width of the vertical light-blocking film 350V may be larger than a width of the second pixel defining line 120_2. The vertical light-blocking film 350V may separate unit pixels PX adjacent to each other in the first direction D1 from each other. For example, the vertical light-blocking film 350V may extend in the second direction D2 to separate the first pixel defining line 1201. The vertical light-blocking film 350V may extend in the second direction D2 to occupy (or, e.g., overlap) one of a plurality of the second pixel defining lines 1202. The vertical light-blocking film 350V may occupy an entirety of the grid point 120g of the pixel defining pattern 120 in the plan view.

Figure 13:
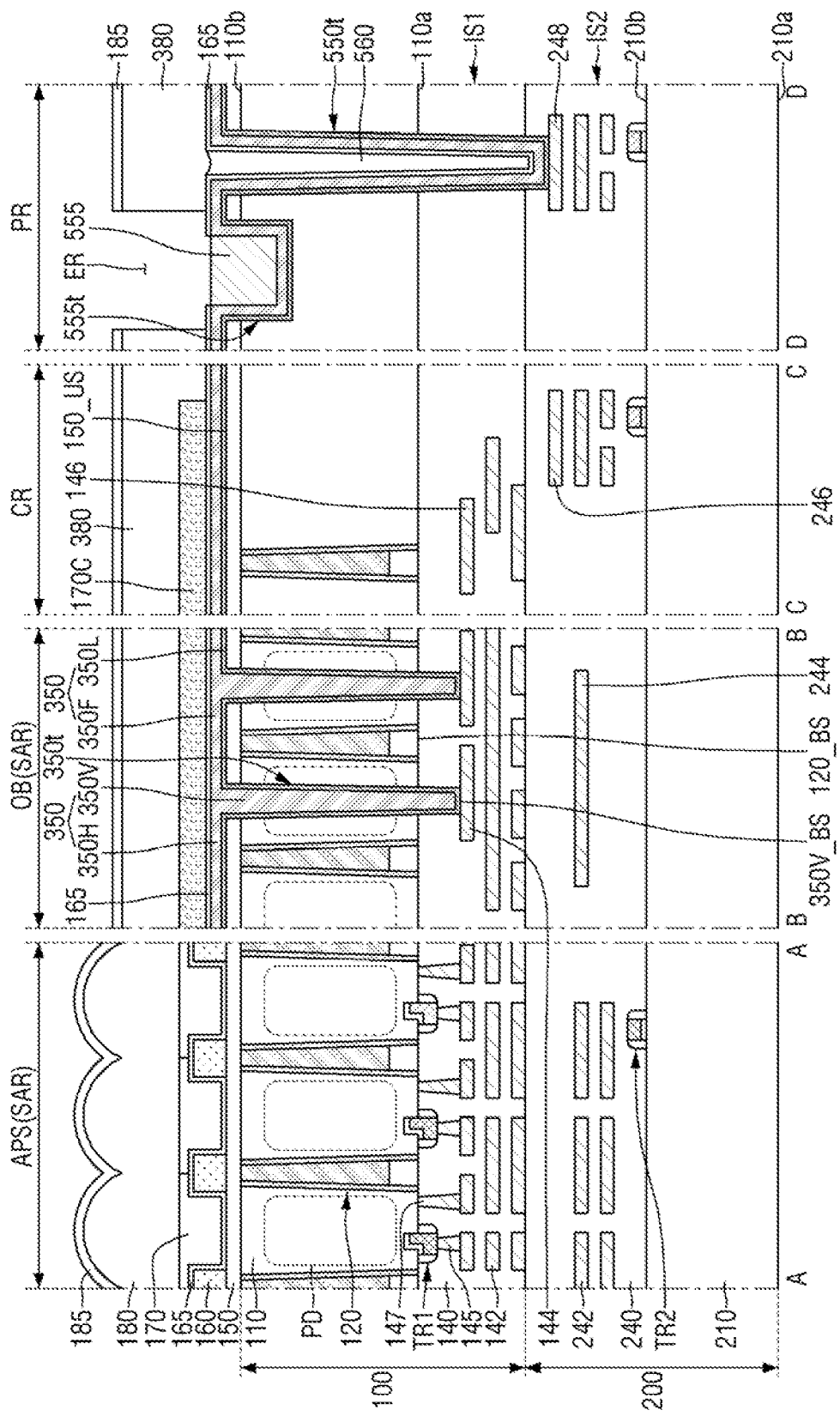
FIG. 13 is a cross-sectional view illustrating an image sensor according to an exemplary embodiment of the present inventive concept.
Figure 14:
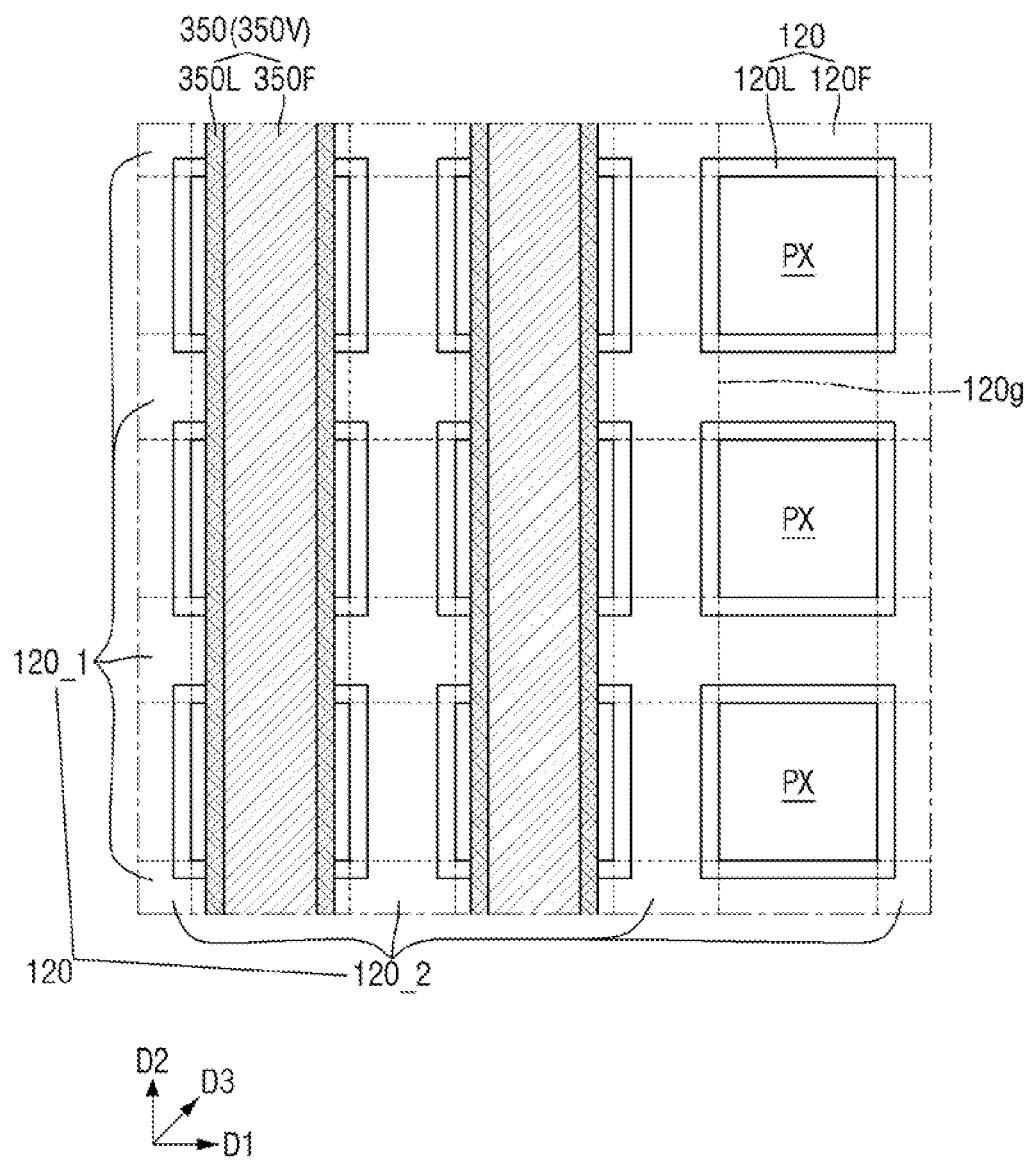
FIG. 14 is a plan view illustrating a vertical light-blocking film and a pixel defining pattern of FIG. 13.

FIG. 13 is a cross-sectional view illustrating an image sensor according to an exemplary embodiment of the present inventive concept. FIG. 14 is a plan view illustrating a vertical light-blocking film and a pixel defining pattern of FIG. 13. For reference, FIG. 13 may be a cross-sectional view taken along the lines A-A, B-B, C-C, and D-D of FIG. 4. For convenience of description, the following descriptions are based on differences therefor from the descriptions using FIGS. 1 to 7. In addition, to the extent that the description of various elements are omitted, it may be assumed that these elements are at least similar to corresponding elements that have already been described.

Referring to FIG. 13 and FIG. 14, the vertical light-blocking film 350V may include at least two vertical light-blocking films.

Each of at least two vertical light-blocking films 350V may be disposed between adjacent portions of the pixel defining pattern 120. The vertical light-blocking film 350V may extend in the second direction D2. The at least two vertical light-blocking films 350V may be spaced apart from each other in the first direction D1. Although the number of the vertical light-blocking films 350V is shown as two, this is intended only as an example. The present inventive concept is not limited thereto.

The vertical light-blocking film 350V may extend in the second direction D2 to separate the first pixel defining line 120_1. The vertical light-blocking film 350V does not separate the second pixel defining line 120_2. In the plan view, the vertical light-blocking film 350V does not occupy (or, e.g., overlap) the second pixel defining line 120_2 and the grid point 120g of pixel defining pattern 120.

Although it is shown that one second pixel defining line 120_2 is disposed between adjacent vertical light-blocking films 350V, the present inventive concept is not limited thereto. In another example, at least two second pixel defining lines 120_2 may be disposed between the adjacent vertical light-blocking films 350V.

Figure 15:
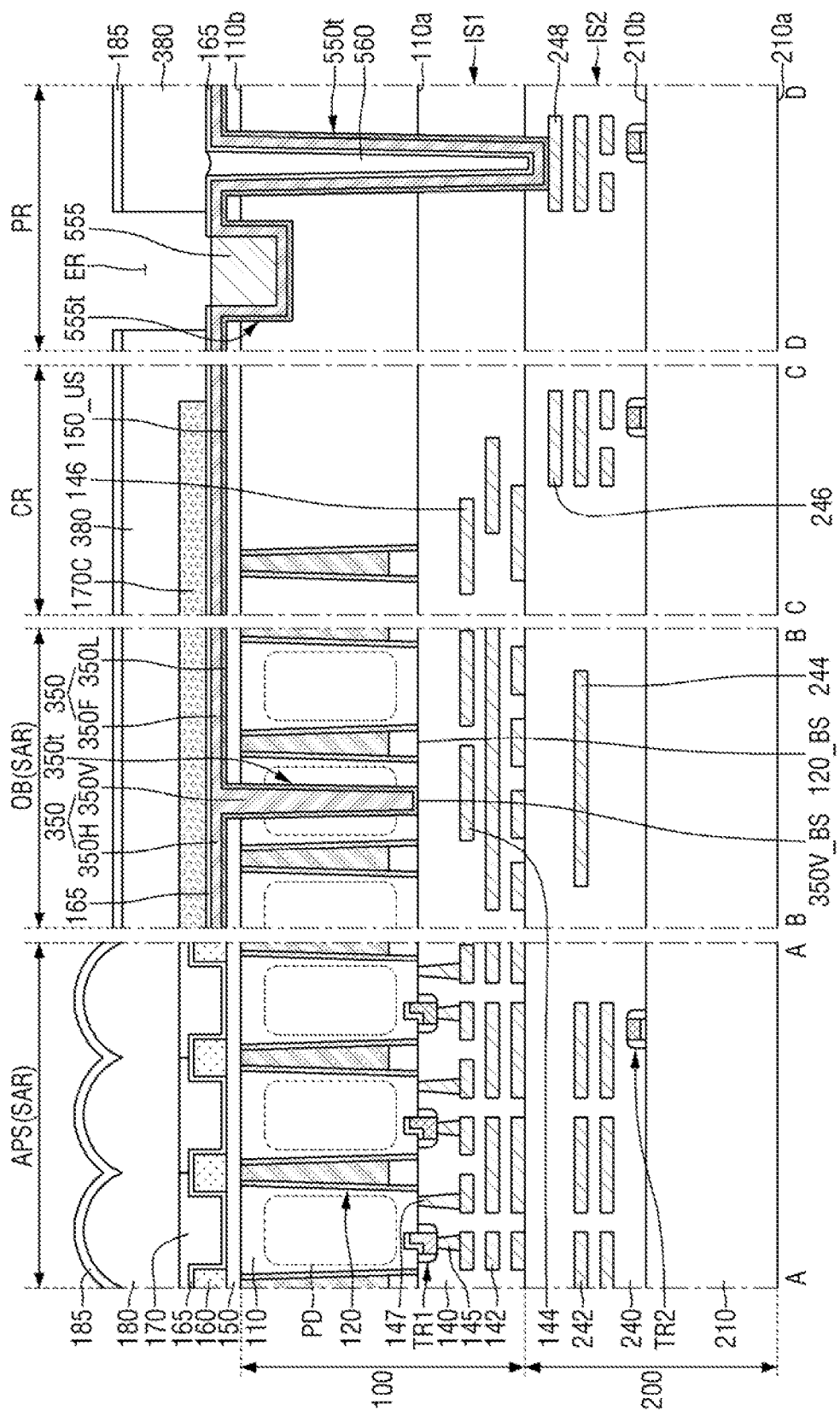
FIG. 15 is a cross-sectional view illustrating an image sensor according to an exemplary embodiment of the present inventive concept.
Figure 16A:
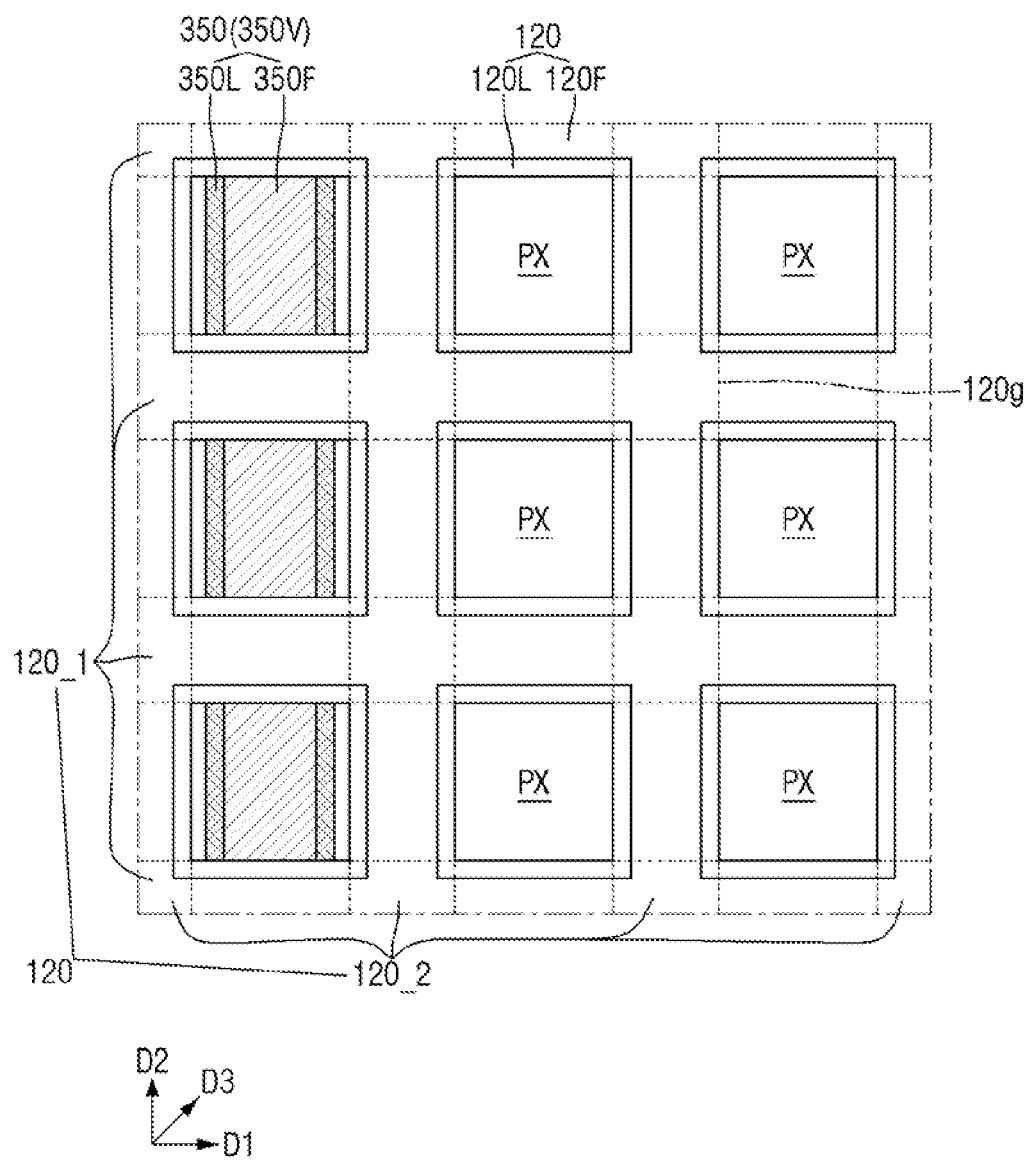
FIG. 16A and FIG. 16B are plan views illustrating a vertical light-blocking film and a pixel defining pattern of FIG. 15.
Figure 16B:
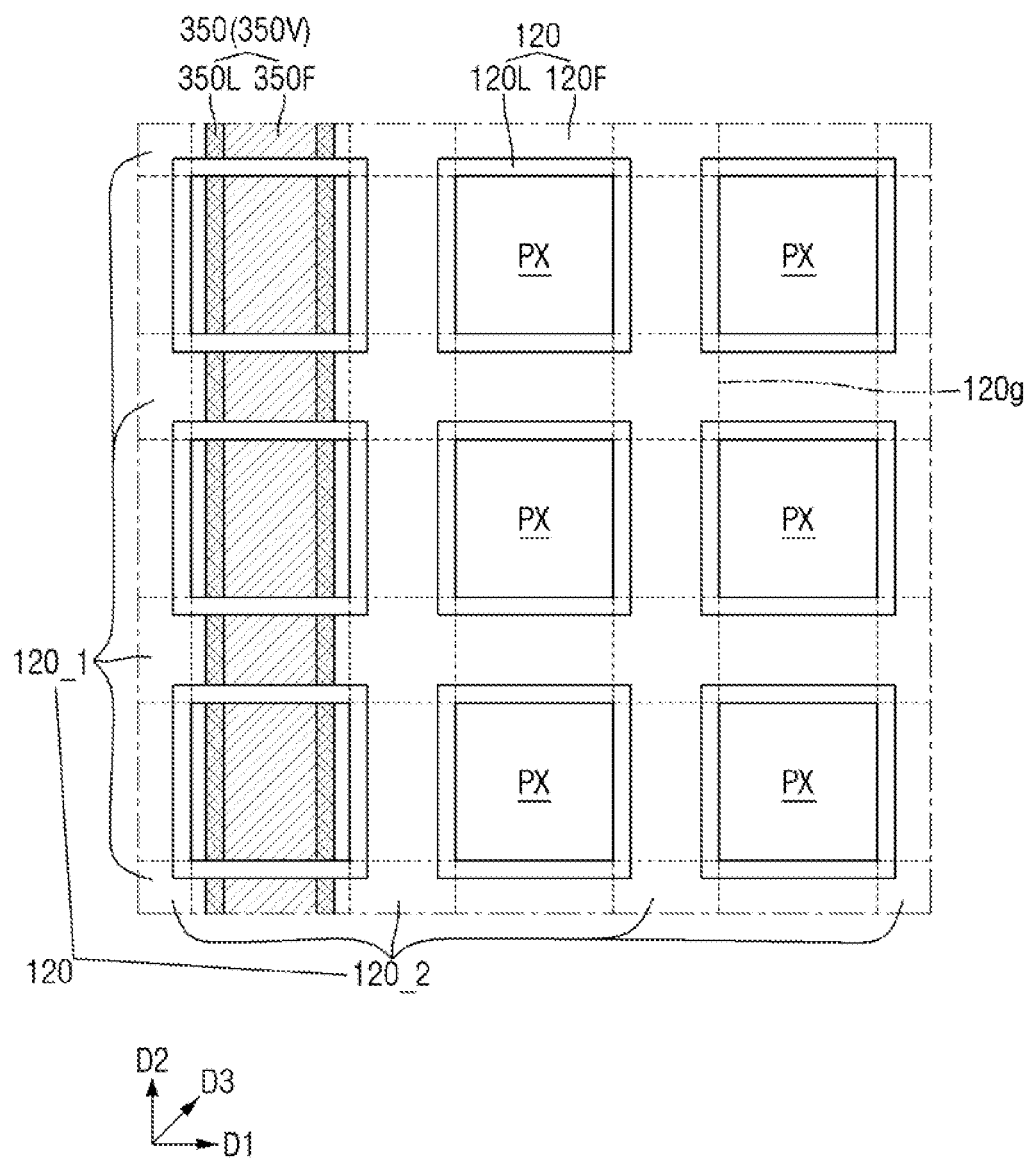

FIG. 15 is a cross-sectional view illustrating an image sensor according to an exemplary embodiment of the present inventive concept. FIG. 16A and FIG. 16B are plan views illustrating a vertical light-blocking film and a pixel defining pattern of FIG. 15. For reference, FIG. 15 may be a cross-sectional view taken along the lines A-A, B-B, C-C, and D-D in FIG. 4. For convenience of description, the following descriptions are based on differences therefor from the descriptions using FIGS. 1 to 7. In addition, to the extent that the description of various elements are omitted, it may be assumed that these elements are at least similar to corresponding elements that have already been described.

Referring to FIG. 15 to FIG. 16B, a bottom surface 350V_BS of the vertical light-blocking film 350V may be coplanar with the bottom surface 120_BS of the pixel defining pattern 120.

In FIG. 15, when using an etchant that has an etching selectivity with respect to the first substrate 110 and the first interline insulating film 140, the first substrate 110 may be etched, while the first interline insulating film 140 might not be etched. In this case, the bottom surface of the first trench 350t may be coplanar with the first surface 110a of the first substrate 110. The bottom surface of the first trench 350t may be coplanar with the bottom face 120_BS of pixel defining pattern 120. For example, the bottom surface 350V_BS of the vertical light-blocking film 350V may be coplanar with the first surface 110a of the first substrate 110 and the bottom face 120_BS of the pixel defining pattern 120.

In FIG. 16A, the vertical light-blocking film 350V may occupy (or, e.g., overlap) a portion of the unit pixel PX in the plan view. The vertical light-blocking film 350V might not occupy the pixel defining pattern 120.

In FIG. 16B, the vertical light-blocking film 350V might not occupy (or, e.g., overlap) the pixel defining liner film 120L in the plan view. The vertical light-blocking film 350V may occupy at least a portion of each of the unit pixel PX and the pixel defining filling film 120F. The unit pixel PX and the pixel defining filling film 120F may have an etching selectivity with respect to the pixel defining liner film 120L. Therefore, in a process of forming the first trench 350t, the pixel defining liner film 120L may not be etched.

Figure 17:
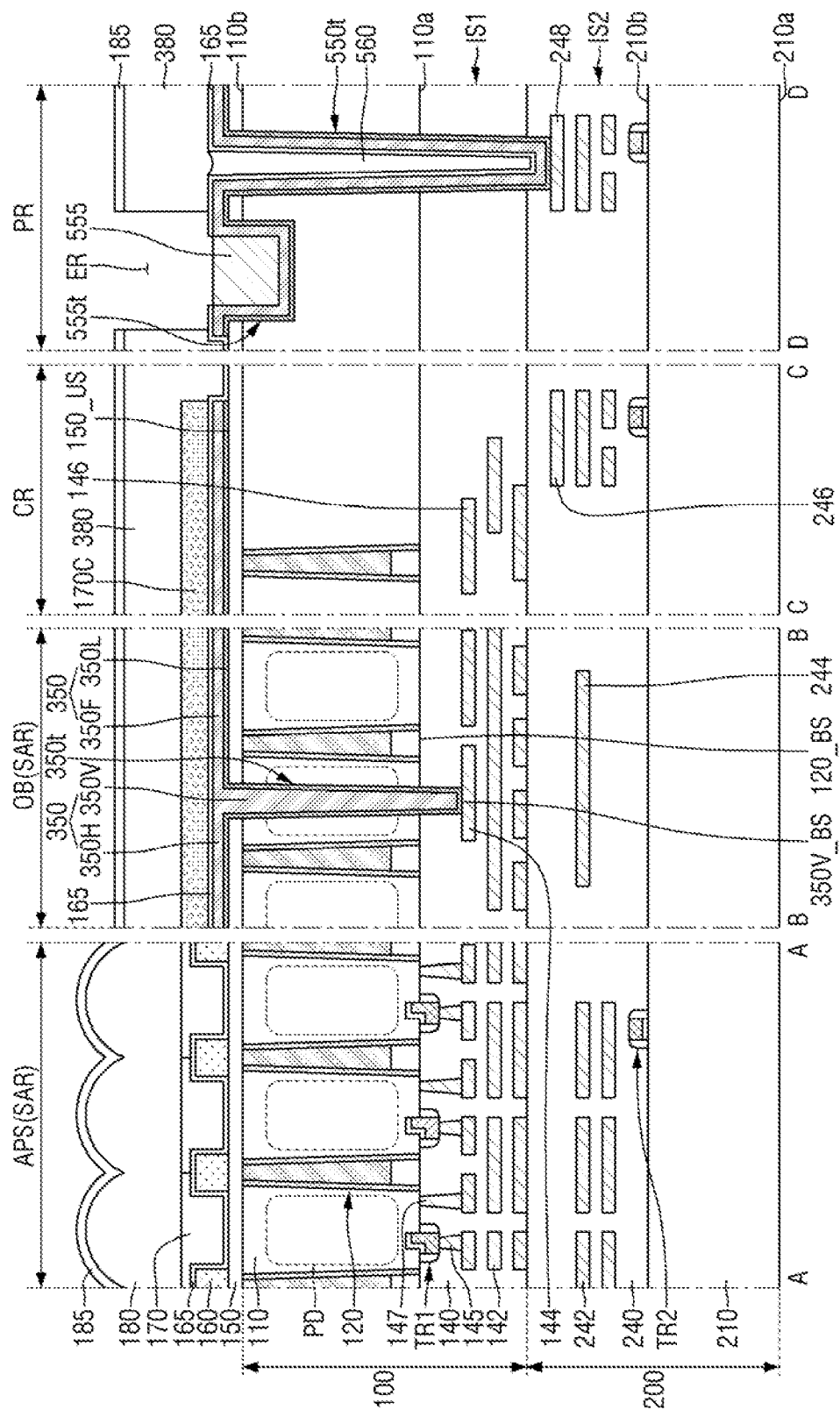
FIG. 17 is a cross-sectional view illustrating an image sensor according to an exemplary embodiment of the present inventive concept.

FIG. 17 is a cross-sectional view illustrating an image sensor according to an exemplary embodiment of the present inventive concept. For reference, FIG. 17 may be a cross-sectional view taken along the lines A-A, B-B, C-C, and D-D of FIG. 4. For convenience of description, the following descriptions are based on differences therefor from the descriptions using FIGS. 1 to 7. In addition, to the extent that the description of various elements are omitted, it may be assumed that these elements are at least similar to corresponding elements that have already been described.

Referring to FIG. 17, the light-blocking film 350 in the light-blocking area OB and the connection area CR and the light-blocking film 350 in the pad area PR may not be connected to each other. In a process of removing the light-blocking film 350 in the light-receiving area APS, a portion of the light-blocking film 350 in a boundary region between the connection area CR and pad area PR may be removed too.

Figure 18:
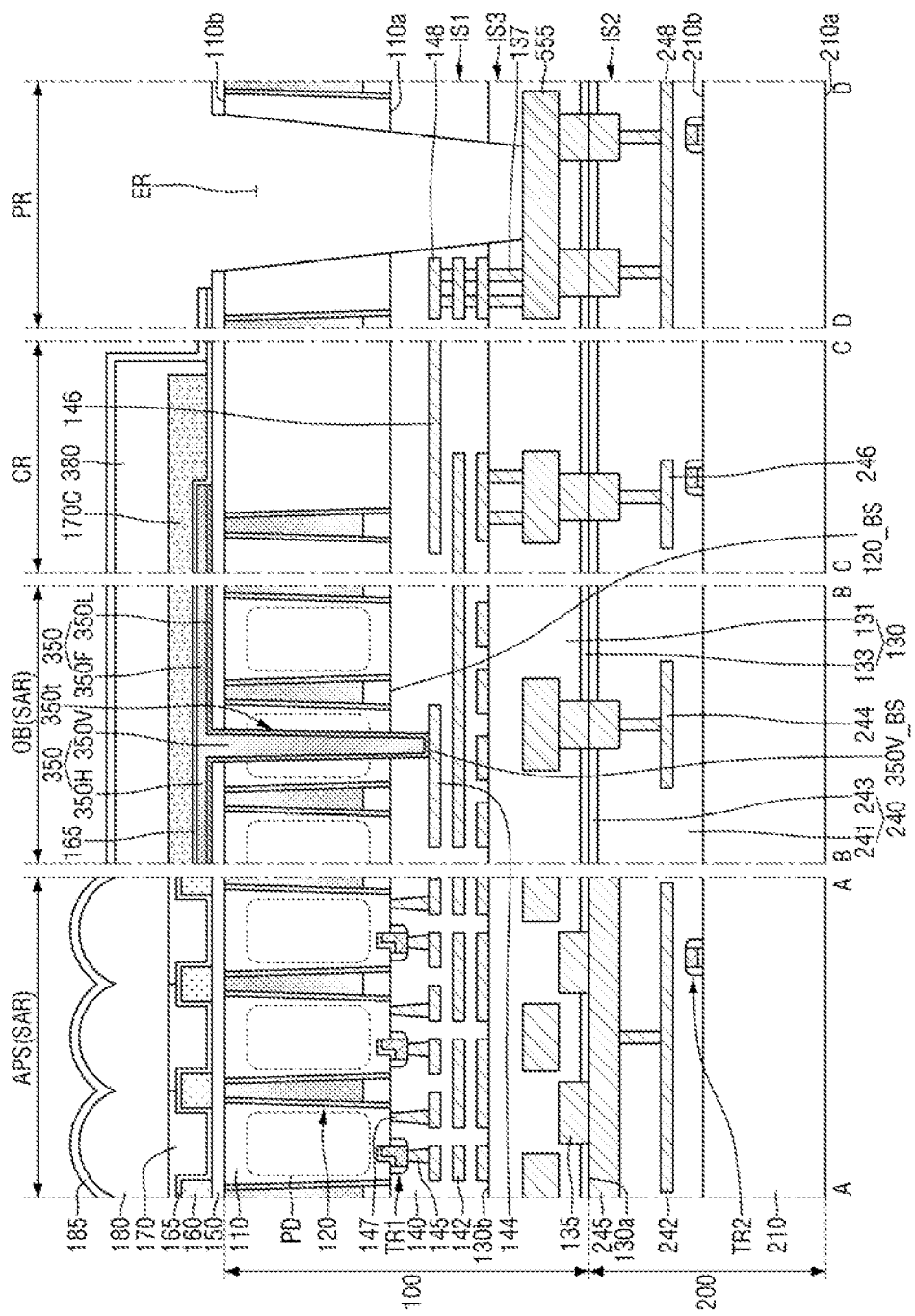
FIG. 18 is a cross-sectional view illustrating an image sensor according to an exemplary embodiment of the present inventive concept.

FIG. 18 is a cross-sectional view for illustrating an image sensor according to an exemplary embodiment of the present inventive concept. For reference, FIG. 18 may be a cross-sectional view taken along the A-A, B-B, C-C, and D-D of FIG. 4. For convenience of description, the following descriptions are based on differences therefor from the descriptions using FIGS. 1 to 7. In addition, to the extent that the description of various elements are omitted, it may be assumed that these elements are at least similar to corresponding elements that have already been described.

Referring to FIG. 18, the pad pattern 555 may be disposed in a third interline insulating film 130.

In an exemplary embodiment of the present inventive concept, the first substrate structure 100 may further include a third line structure IS3. The third line structure IS3 may be disposed between the first line structure IS1 and the second line structure IS2. For example, the third line structure IS3 may contact the first line structure IS1 and the second line structure IS2.

The third line structure IS3 may include the third interline insulating film 130, the pad pattern 555, a first connective pattern 135 and a plurality of contacts 137. In FIG. 18, the connective pattern forming the third line structure IS3, the number of layers of the contacts thereof and the arrangement thereof are only an example.

The third interline insulating film 130 may include a top surface 130b and a bottom surface 130a. The top surface 130b of the third interline insulating film 130 may face toward the first surface 110a of the first substrate 110. The bottom surface 130a of the third interline insulating film 130 may face toward the fourth surface 210b of the second substrate 210.

The third interline insulating film 130 may include a first interlayer insulating film 131 and a first bonding insulating film 133. The first bonding insulating film 133 may be disposed on the first interlayer insulating film 131. A bottom surface of the first bonding insulating film 133 may act as a bottom surface 130a of the third interline insulating film 130. A top surface of the first interlayer insulating film 131 may act as a top surface 130b of the third interline insulating film 130. For example, the first interlayer insulating film 131 may provide the top surface 130b of the third interline insulating film 130, and the first bonding insulating film 133 may provide the bottom surface 130a of the third interline insulating film 130.

The first interlayer insulating film 131 may include, for example, at least one of silicon oxide, silicon nitride, silicon oxynitride and a low-k material having a lower dielectric constant than that of silicon oxide. The present inventive concept is not limited thereto.

The first bonding insulating film 133 may include, for example, silicon carbonitride (SiCN), but the present inventive concept is not limited thereto.

The pad pattern 555 may be embedded in the third interline insulating film 130. The pad pattern 555 may be embedded in the first interlayer insulating film 131. In the pad area PR, a surface of the pad pattern 555 may be exposed. The pad pattern 555 may be exposed through the surface insulating film 150, the first substrate 110, the first interline insulating film 140 and the third interline insulating film 130. For example, an exposure opening ER exposing the pad pattern 555 may be formed in the third interline insulating film 130. Accordingly, the pad pattern 555 may be connected to an external device and the like, and may be configured to transmit or receive an electrical signal between the image sensor according to an exemplary embodiment of the present inventive concept and the external device.

In an exemplary embodiment of the present inventive concept, the pad pattern 555 may at least partially protrude beyond the third interline insulating film 130. In an exemplary embodiment of the present inventive concept, the pad pattern 555 may be disposed at an upper surface of the third interline insulating film 130.

The pad pattern 555 may include, for example, at least one of tungsten (W), copper (Cu), aluminum (Al), gold (Au), silver (Ag), titanium nitride (TiN), or alloys thereof. The present inventive concept is not limited thereto.

The third contact 137 may connect the pad pattern 555 to the plurality of wire patterns 148 of the first line structure IS1. The third contact 137 may include, for example, at least one of tungsten (W), copper (Cu), aluminum (Al), gold (Au), silver (Ag), or alloys thereof. The present inventive concept is not limited thereto.

The first connective pattern 135 may be disposed within the third interline insulating film 130. The first connective pattern 135 may extend through the first bonding insulating film 133. A bottom surface of the first connective pattern 135 may be coplanar with a bottom surface 130a of the third interline insulating film 130. A bottom surface of the first connective pattern 135 may be coplanar with a bottom surface of the first bonding insulating film 133.

The first connective pattern 135 may contact the bottom face 130a of the third interline insulating film 130. The first connective pattern 135 may contact the top face of the second interline insulating film 240. The first connective pattern 135 may have one of various column shapes such as, for example, a cylindrical shape, a truncated cone shape, a polygonal prism shape, and a polygonal truncated pyramid shape.

In the light-receiving area APS, the first connective pattern 135 might not contact the pad pattern 555. A second connective pattern 245 may contact the first connective pattern 135. In the light-blocking area OB, the connection area CR, and the pad area PR, the first connective pattern 135 may contact the pad pattern 555. However, the present inventive concept is not limited thereto.

The first connective pattern 135 may include a conductive material. The first connective pattern 135 may include, for example, copper (Cu). The present inventive concept is not limited thereto.

In an exemplary embodiment of the present inventive concept, the second interline insulating film 240 may include a second interlayer insulating film 241 and a second bonding insulating film 243. A bottom surface of the second interline insulating film 240 may act as a bottom surface of the second interlayer insulating film 241. A top surface of the second interline insulating film 240 may act as a top surface of the second bonding insulating film 243. For example, the second interlayer insulating film 241 may provide the bottom surface of the second interline insulating film 240, and the second bonding insulating film 243 may provide the top face of the second interline insulating film 240.

The second interlayer insulating film 241 may include, for example, at least one of silicon oxide, silicon nitride, silicon oxynitride or a low-k material having a lower dielectric constant than that of silicon oxide. The present inventive concept is not limited thereto. The second bonding insulating film 243 may include, for example, silicon carbonitride (SiCN) in an exemplary embodiment of the present inventive concept. However, the present inventive concept is not limited thereto.

The second line structure IS2 may further include the second connective pattern 245. The second connective pattern 245 may be disposed within the second interline insulating film 240. The second connective pattern 245 may extend through the second bonding insulating film 243. A top surface of the second connective pattern 245 may be coplanar with the top surface of the second interline insulating film 240. The second connective pattern 245 may be bonded to the first connective pattern 135. For example, the second connective pattern 245 may be directly bonded to the first connective pattern 135. The first bonding insulating film 133 may be bonded to the second bonding insulating film 243. For example, the first bonding insulating film 133 may be directly bonded to the second bonding insulating film 243.

In an exemplary embodiment of the present inventive concept, the pad pattern 555, the first connective pattern 135, and the second connective pattern 245 may be electrically connected to each other. When the pad pattern 555 and the first connective pattern 135 are not connected to each other, a contact pattern connecting the pad pattern 555 to the second connective pattern 245 may be formed. The pad pattern 555 may be connected to the second connective pattern 245. The second connective pattern 245 may be connected to the first connective pattern 135. For example, the pad pattern 555, the first connective pattern 135, and the second connective pattern 245 may be electrically connected to each other. However, the present inventive concept is not limited thereto.

FIGS. 19 to 26 are diagrams of intermediate structures for illustrating a method for manufacturing an image sensor according to an exemplary embodiment of the present inventive concept. For reference, FIGS. 19 to 26 may be directed to intermediate structures relating to a method of manufacturing the light-blocking film 350 of the image sensor according to an exemplary embodiment of the present inventive concept.

Hereinafter, a method for manufacturing an image sensor according to an exemplary embodiment of the present inventive concept will be described with reference to FIGS. 19 to 26.

Figure 19:
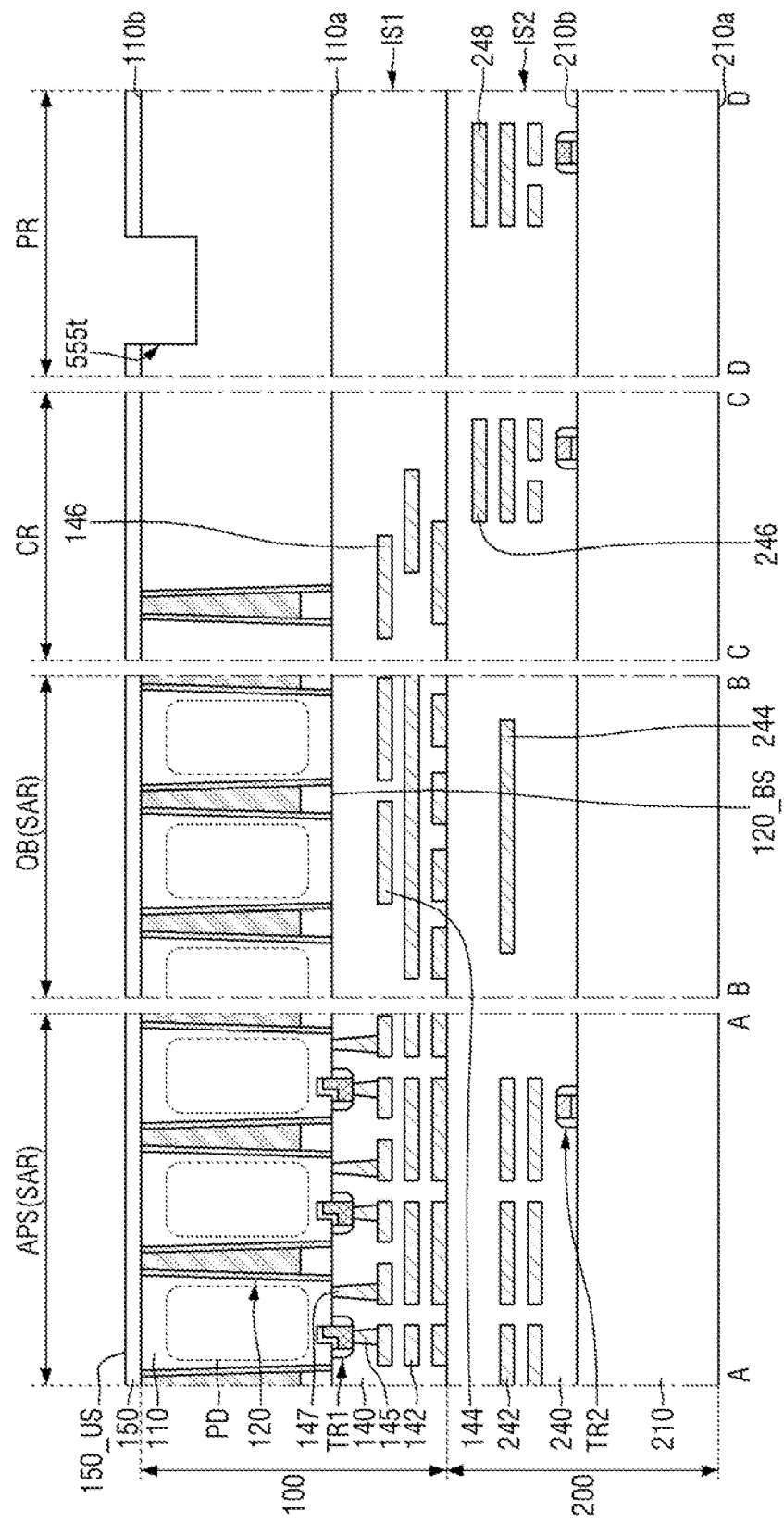
FIGS. 19, 20, 21, 22, 23, 24, 25 and 26 are diagrams of intermediate structures for illustrating a method for manufacturing an image sensor according to an exemplary embodiment of the present inventive concept.

Referring to FIG. 19, the surface insulating film 150 may be formed on the second face 110b of the first substrate 110.

The surface insulating film 150 may extend along the second face 110b of the first substrate 110. The surface insulating film 150 may be formed on the first substrate 110, the photoelectric conversion layer PD, and the pixel defining pattern 120.

Subsequently, in the pad area PR, a portion of each of the surface insulating film 150 and the first substrate 110 may be removed to form the third trench 555t. The third trench 555t may be a trench in which the pad pattern is to be disposed.

Figure 20:
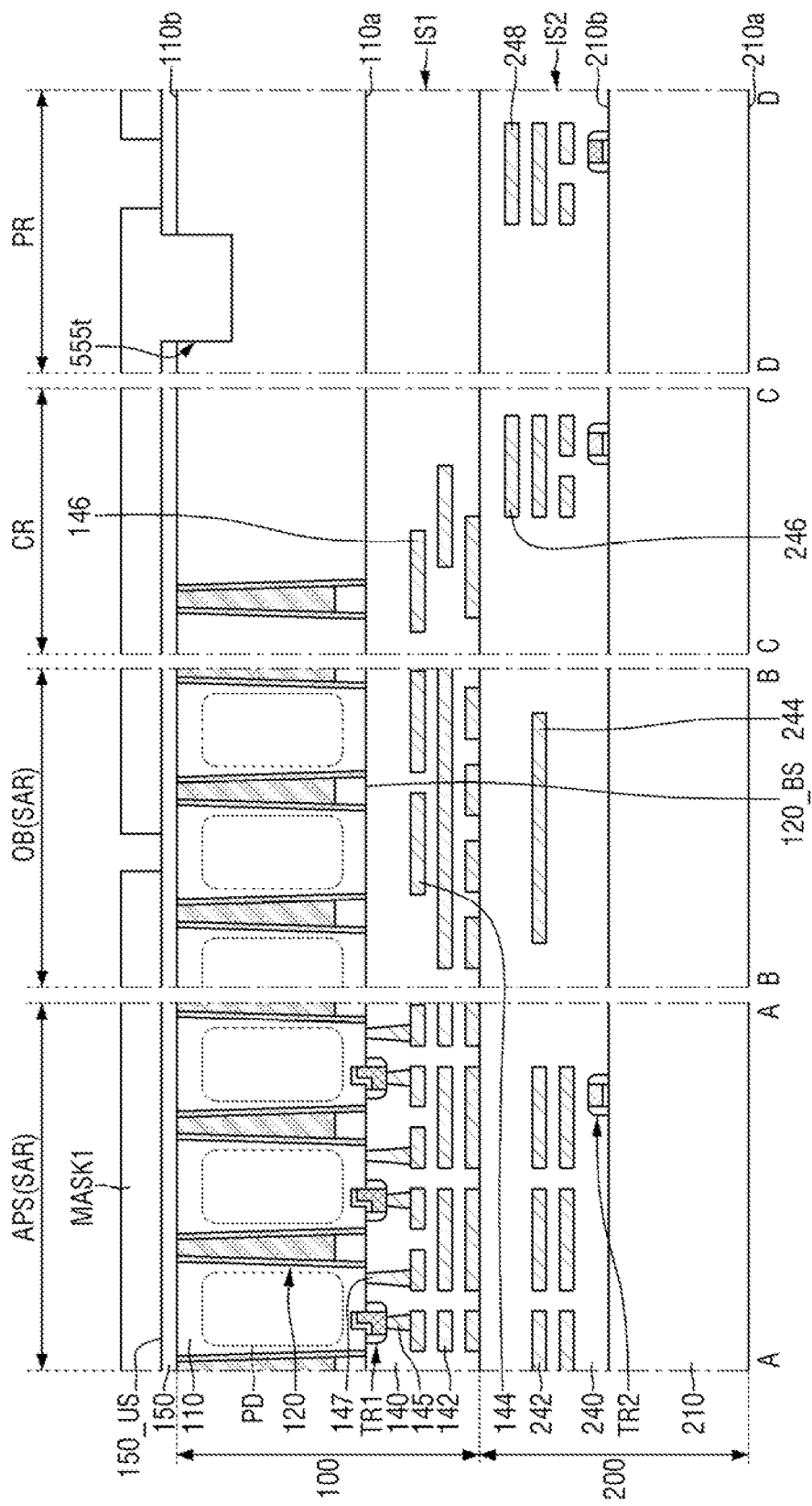

Referring to FIG. 20, a first mask pattern MASK1 may be formed on the surface insulating film 150.

The first mask pattern MASK1 may be used for forming the first trench 350t and the second trench 550t, which will be described later. The first mask pattern MASK1 may be embodied as, for example, a photoresist. The present inventive concept is not limited thereto.

Figure 21:
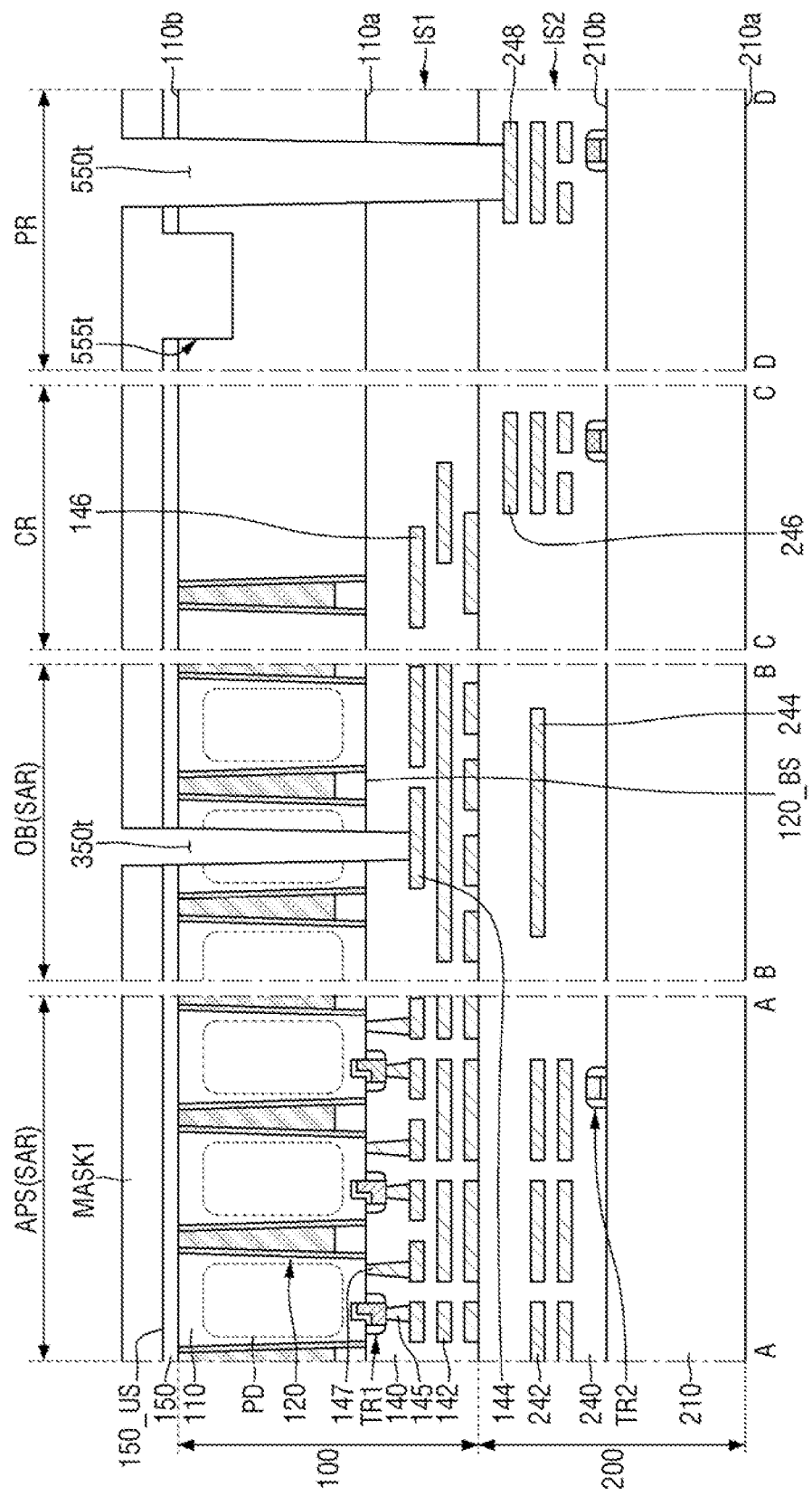

Referring to FIG. 21, the first trench 350t and the second trench 550t may be formed.

Using the first mask pattern MASK1, the first trench 350t may be formed in the light-blocking area OB. Using the first mask pattern MASK1, the second trench 550t may be formed in the pad area PR.

The first trench 350t may be formed between adjacent portions of the pixel defining pattern 120. The first trench 350t may extend through the surface insulating film 150 and the first substrate 110. A portion of the first interline insulating film 140 may be removed in the process in which the first trench 350t is formed. The first trench 350t may expose the second wire pattern 144. The second wire pattern 144 may be used as an etching stop film. For example, in a process of forming the first trench 350t, the second wire pattern 144 may be used as an etching stop film. When a top surface of the second wire pattern 144 is exposed while etching the surface insulating film 150, the first substrate 110, and the first interline insulating film 140, an etching process may be terminated.

The second trench 550t may be formed in the pad area PR. The second trench 550t may extend through the surface insulating film 150, the first substrate 110, and the first interline insulating film 140. In a process of forming the second trench 550t, a portion of the second interline insulating film 240 may be removed. The second trench 550t may expose the seventh wire pattern 248. The seventh wire pattern 248 may be used as an etching stop film in the process of forming the second trench 550t. When a top surface of the seventh wire pattern 248 is exposed while etching the surface insulating film 150, the first substrate 110, the first interline insulating film 140, and the second interline insulating film 240, an etching process may be terminated.

Figure 22:
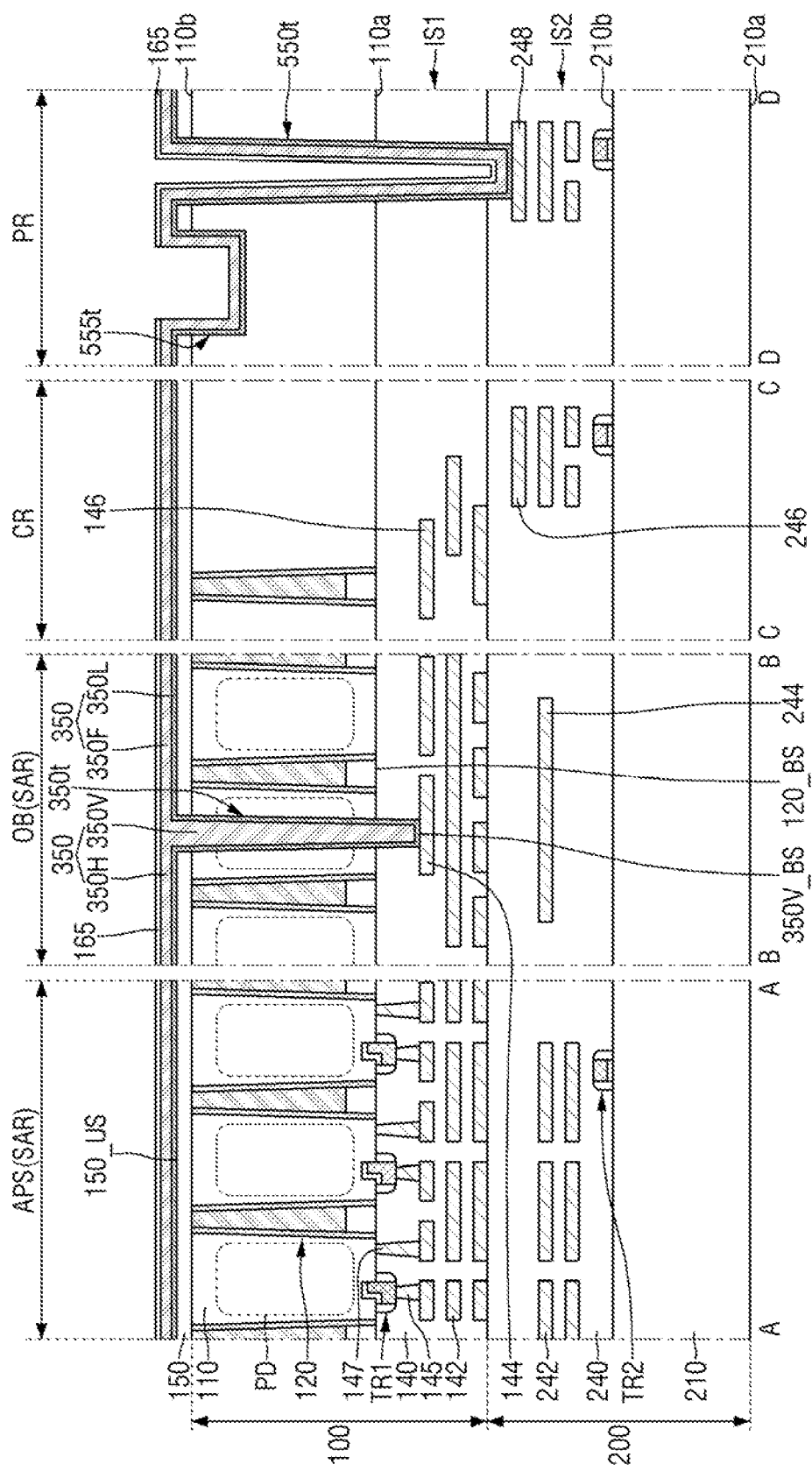

Referring to FIG. 22, the first mask pattern MASK1 may be removed. Subsequently, the light-blocking film 350 may be formed on the surface insulating film 150.

The light-blocking film 350 may fill the first trench 350t. The light-blocking film 350 may extend along the side wall and the bottom surface of the second trench 550t and along the side wall and the bottom surface of the third trench 555t in the pad area PR.

The light-blocking film 350 may include the horizontal light-blocking film 350H and the vertical light-blocking film 350V. The horizontal light-blocking film 350H may be formed along the top surface 150_US of the surface insulating film 150 and along the side wall and the bottom surface of the second trench 550t. In addition, the horizontal light-blocking film 350H may extend along the side wall and the bottom face of the third trench 555t. The vertical light-blocking film 350V may fill the first trench 350t. The vertical light-blocking film 350V may be electrically connected to the second wire pattern 144. For example, the bottom surface 350V_BS of the vertical light-blocking film 350V may contact the second wire pattern 144. A vertical level of the bottom surface 350V_BS of the vertical light-blocking film 350V may be lower than that of each of the bottom surface 120_BS of the pixel defining pattern 120 and the first surface 110a of the first substrate 110.

The light-blocking film 350 may include the light-blocking liner film 350L and the light-blocking filling film 350F. The light-blocking liner film 350L may be formed along the top surface 150_US of the surface insulating film 150, the side wall and the bottom surface of the first trench 350t, the side wall and the bottom surface of the second trench 550t, and the side wall and the bottom surface of the third trench 555t The light-blocking filling film 350F may be disposed on the light-blocking liner film 350L. First, the light-blocking liner film 350L may be formed, and then, the light-blocking filling film 350F may be formed on the light-blocking liner film 350L.

Subsequently, the first protective film 165 may be formed on the light-blocking film 350.

Figure 23:
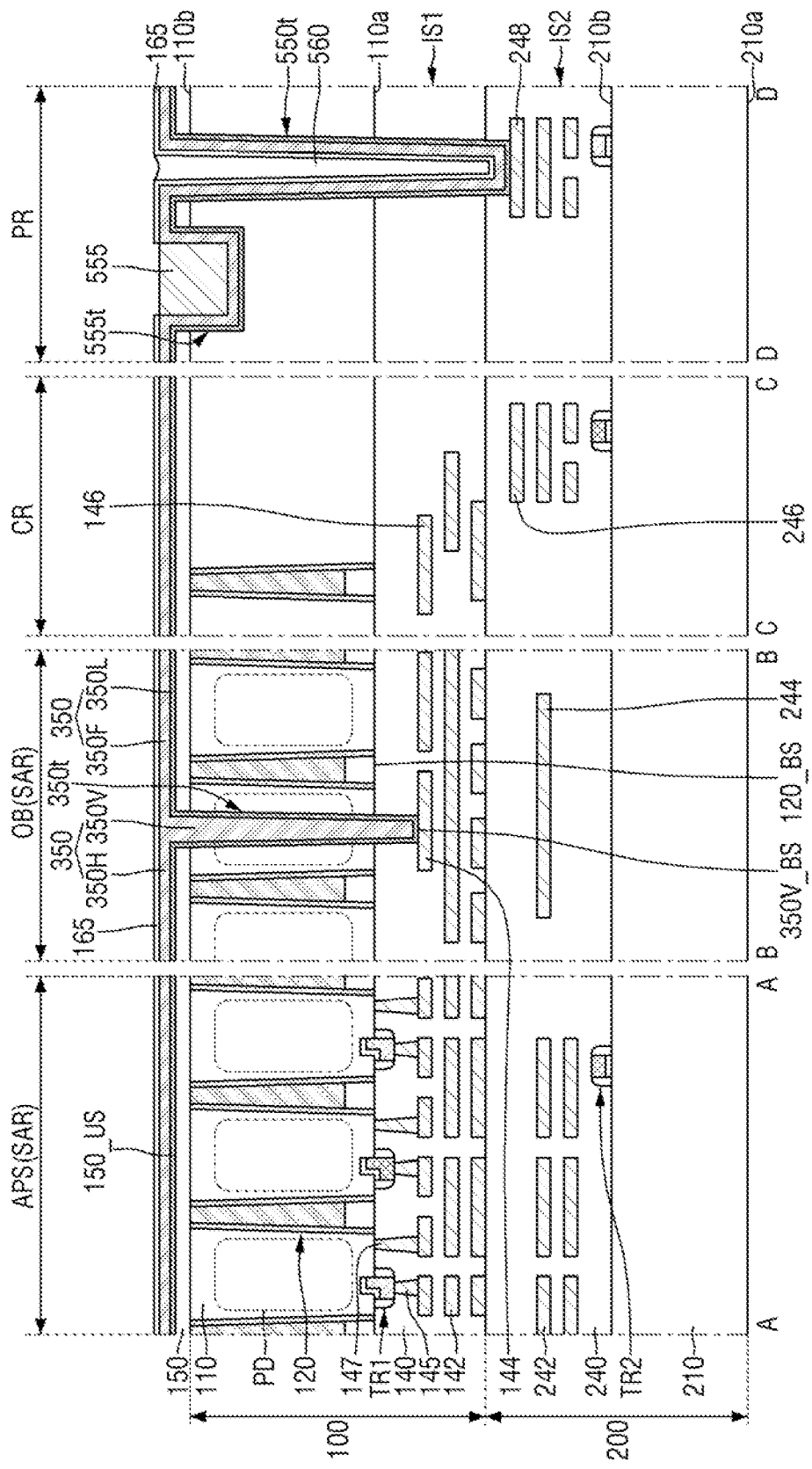

Referring to FIG. 23, the filling insulating film 560 and the pad pattern 555 may be formed.

The filling insulating film 560 may fill a portion of the second trench 550t remaining after the light-blocking film 350 and the first protective film 165 are formed therein. The pad pattern 555 may fill a portion of the third trench 555t remaining after the light-blocking film 350 is formed therein.

Figure 24:
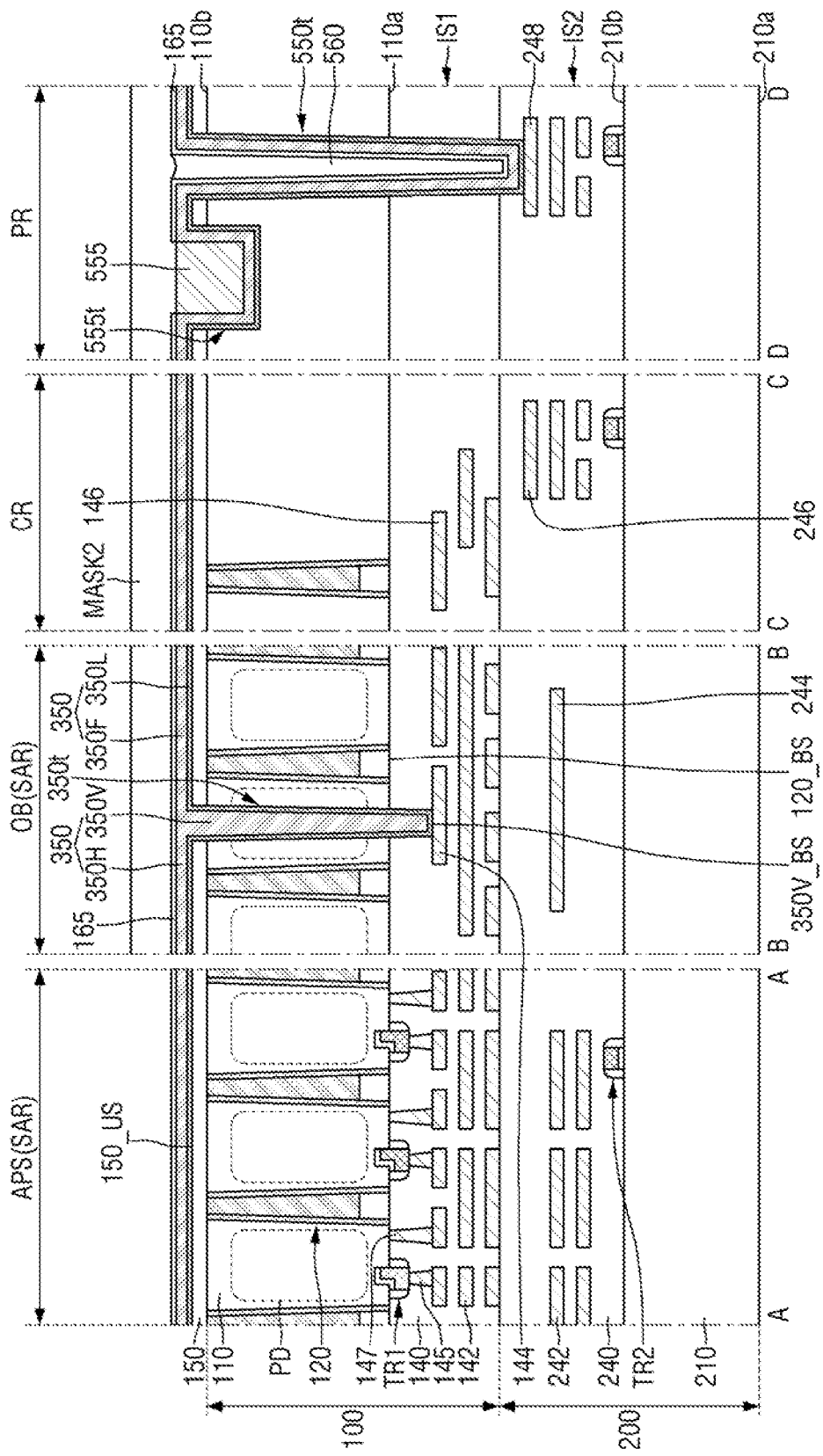

Referring to FIG. 24, a second mask pattern MASK2 may be formed on the light-blocking film 350.

The second mask pattern MASK2 may be used for removing the light-blocking film 350 in the light-receiving area APS. The second mask pattern MASK2 may expose the top face 150_US of the surface insulating film 150 of the light-receiving area APS.

Figure 25:
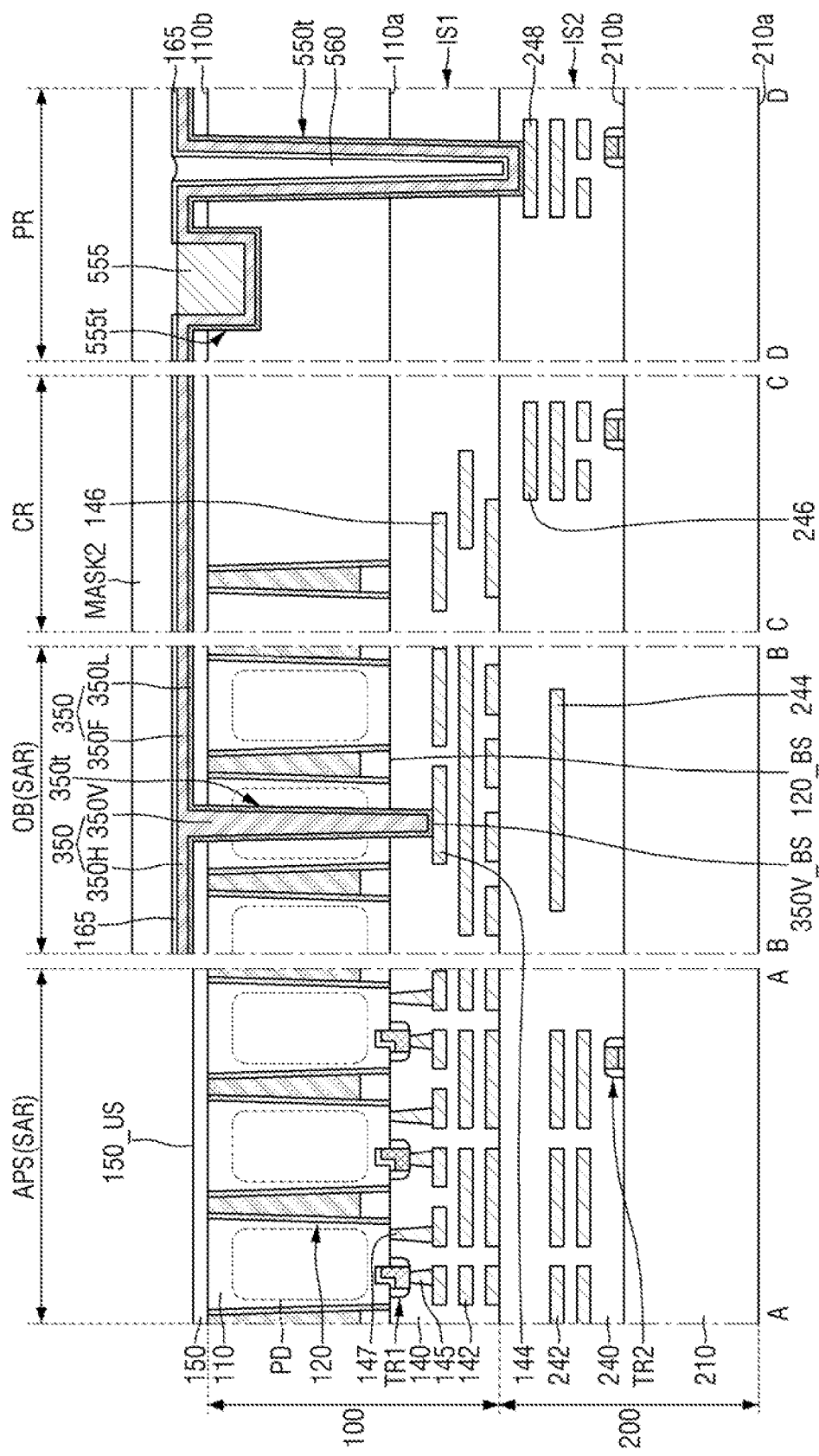

Referring to FIG. 25, the light-blocking film 350 in the light-receiving area APS may be removed.

The top surface 150_US of the surface insulating film 150 of the light-receiving area APS may be exposed. The light-blocking film 350 may be formed in the light-blocking area OB, the connection area CR, and the pad area PR.

Figure 26:
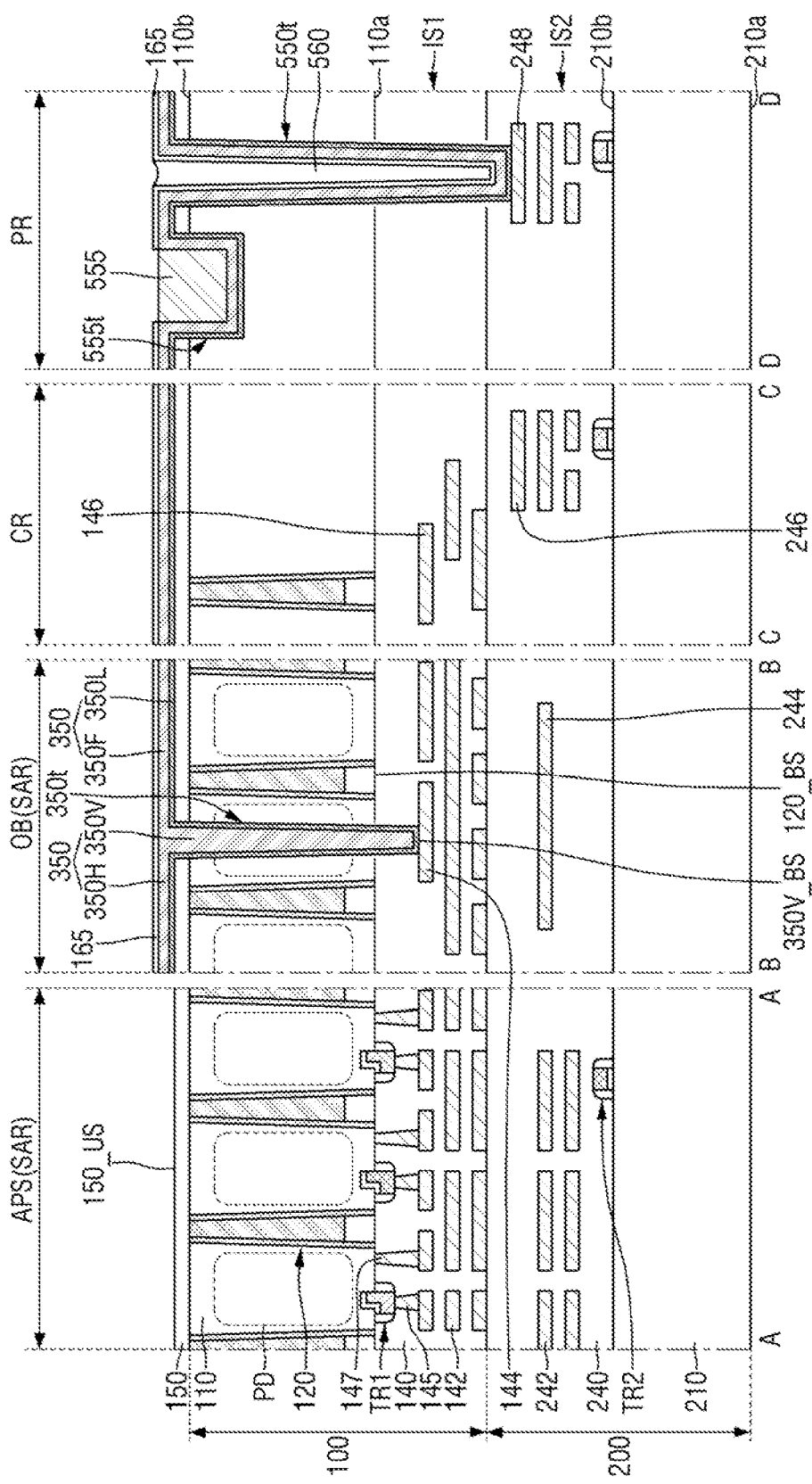

Referring to FIG. 26, the second mask pattern MASK2 may be removed.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. An image sensor comprising:
a substrate including first and second surfaces opposite to each other, and including a first area and a second area;
a plurality of unit pixels disposed in the substrate, wherein each of the plurality of unit pixels includes a photoelectric conversion layer;
a pixel defining pattern disposed in the substrate and extending from the second surface of the substrate toward the first surface of the substrate, wherein the pixel defining pattern separates the unit pixels from each other;
a surface insulating film disposed on the second surface of the substrate;
a line structure disposed on the first surface of the substrate, wherein the line structure includes a first interline insulating film and a wire pattern disposed in the first interline insulating film;
a micro-lens disposed in the first area; and
a light-blocking film disposed in the second area,
wherein the light-blocking film includes:
a horizontal light-blocking film extending along a top surface of the surface insulating film; and
a vertical light-blocking film extending through the surface insulating film and the substrate, wherein the vertical light-blocking film is electrically connected to the wire pattern,
wherein the light-blocking film is electrically connected to the pixel defining pattern,
wherein the vertical light-blocking film at least partially fills a trench extending through the surface insulating film and the substrate,
wherein the light-blocking film includes:
a light-blocking liner film that extends from the top surface of the surface insulating film to a bottom surface of the trench; and
a light-blocking filling film disposed on the light-blocking liner film,
wherein the substrate includes a third area disposed adjacent to the second area,
wherein the image sensor further comprises a first pad pattern disposed within the substrate and in the third area,
wherein the light-blocking film is electrically connected to the first pad pattern.

2. The image sensor of claim 1, wherein a bottom surface of the vertical light-blocking film is coplanar with a bottom surface of the pixel defining pattern.

3. The image sensor of claim 1,
wherein the light-blocking liner film extends along the top surface of the surface insulating film, a side wall of the trench, and a bottom surface of the trench.

4. The image sensor of claim 3, wherein the light-blocking liner film includes titanium nitride, titanium, or a combination thereof,
wherein the light-blocking filling film includes tungsten.

5. The image sensor of claim 1, wherein the vertical light-blocking film is disposed between adjacent portions of the pixel defining pattern.

6. The image sensor of claim 5, wherein a width of the vertical light-blocking film is smaller than a width of each unit pixel.

7. The image sensor of claim 1, wherein the pixel defining pattern has a grid shape,
wherein the vertical light-blocking film is disposed on at least a portion of a grid point of the pixel defining pattern.

8. The image sensor of claim 1, wherein the vertical light-blocking film includes a plurality of vertical light-blocking film.

9. The image sensor of claim 1, wherein the image sensor further comprises:
a second interline insulating film disposed on the first surface of the substrate; and
a second pad pattern disposed within the second interline insulating film.

10. An image sensor comprising:
a substrate including first and second surfaces facing each other, and including a first area and a second area;
a pixel defining pattern extending from the first surface of the substrate to the second surface of the substrate, wherein the pixel defining pattern includes a first pixel defining line extending in a first direction, and a second pixel defining line extending in a second direction different from the first direction;
a plurality of unit pixels defined by the pixel defining pattern and disposed in the substrate, wherein each of the plurality of unit pixels includes a photoelectric conversion layer;
a micro-lens disposed in the first area;
a line structure disposed on the first surface of the substrate, wherein the line structure includes a first interline insulating film and a wire pattern disposed in the first interline insulating film;
a horizontal light-blocking film disposed in the second area and on the second surface of the substrate, and
a vertical light-blocking film extending through the substrate and connected to the horizontal light-blocking film, wherein the vertical light-blocking film is electrically connected to the wire pattern, wherein the vertical light-blocking film extends in a third direction, and separates the first pixel defining line, wherein the third direction is different from at least the first direction, wherein the vertical light-blocking film and the pixel defining pattern are electrically connected to each other, wherein the vertical light-blocking film at least partially fills a trench extending through a surface insulating film which is disposed on the substrate, and the substrate, wherein the vertical light-blocking film includes:
 a light-blocking liner film that extends from a top surface of the surface insulating film to a bottom surface of the trench; and
 a light-blocking filling film disposed on the light-blocking liner film, wherein the substrate includes a third area disposed adjacent to the second area, wherein the image sensor further comprises a first pad pattern disposed in the third area, wherein the horizontal light-blocking film is electrically connected to the first pad pattern.

11. The image sensor of claim 10, wherein the third direction is identical with the second direction.

12. The image sensor of claim 11, wherein the vertical light-blocking film occupies at least one of a plurality of second pixel defining lines.

13. The image sensor of claim 10, wherein the third direction intersects the first direction and the second direction.

14. The image sensor of claim 10, wherein a bottom surface of the vertical light-blocking film is coplanar with a bottom surface of the pixel defining pattern.

15. The image sensor of claim 10, wherein the image sensor further comprises:
 a second interline insulating film disposed on the first surface of the substrate; and
 a second pad pattern disposed within the second interline insulating film.

16. An image sensor comprising:
 a substrate including first and second surfaces opposite to each other, and including a first area, a second area, and a third area;
 a plurality of unit pixels disposed in the substrate, wherein each of the plurality of unit pixels includes a photoelectric conversion layer;
 a pixel defining pattern between the first surface and the second surface of the substrate, wherein the pixel defining pattern separates the unit pixels from each other;
 a surface insulating film disposed on the second surface of the substrate;
 a line structure disposed on the first surface of the substrate, wherein the line structure includes an interline insulating film and a wire pattern disposed in the interline insulating film;
 a micro-lens disposed in the first area;
 a light-blocking film disposed in the second area, wherein the light-blocking film includes:
  a horizontal light-blocking film extending along a top surface of the surface insulating film; and
  a vertical light-blocking film extending through the surface insulating film and the substrate, wherein the vertical light-blocking film is electrically connected to the wire pattern; and
 a pad pattern disposed in the third area, wherein the pad pattern is electrically connected to the light-blocking film, wherein the pixel defining pattern includes a plurality of first pixel defining lines and a plurality of second pixel defining lines, wherein the plurality of first pixel defining lines extend in a first direction, and the plurality of second pixel defining lines extend in a second direction different from the first direction, wherein the vertical light-blocking film extends in the second direction in a plan view of the image sensor and separates each of the first pixel defining lines, wherein the light-blocking film is electrically connected to the pixel defining pattern, wherein the vertical light-blocking film at least partially fills a trench extending through the surface insulating film and the substrate, wherein the light-blocking film includes:
 a light-blocking liner film that extends from the top surface of the surface insulating film to a bottom surface of the trench; and
 a light-blocking filling film disposed on the light-blocking liner film.

17. The image sensor of claim 16,
Wherein the light-blocking liner film extends along a top surface of the surface insulating film, a side wall of the trench, and a bottom surface of the trench.

18. The image sensor of claim 17, wherein the light-blocking liner film includes titanium nitride, titanium, or a combination thereof,
wherein the light-blocking filling film includes tungsten.

* * * * *